(12) United States Patent
Vafai et al.

(10) Patent No.: US 11,710,723 B2
(45) Date of Patent: Jul. 25, 2023

(54) THERMAL MANAGEMENT OF THREE-DIMENSIONAL INTEGRATED CIRCUITS

(71) Applicant: KAMBIX INNOVATIONS, LLC, Albuquerque, NM (US)

(72) Inventors: Kambiz Vafai, Mission Viejo, CA (US); Andisheh Tavakoli, Irvine, CA (US); Mohammad Reza Salimpour, Irvine, CA (US)

(73) Assignee: Kambix Innovations, LLC, Albuquerque, NM (US)

( * ) Notice: Subject to any disclaimer, the term of this patent is extended or adjusted under 35 U.S.C. 154(b) by 153 days.

(21) Appl. No.: 17/401,719

(22) Filed: Aug. 13, 2021

(65) Prior Publication Data

US 2023/0047658 A1    Feb. 16, 2023

Related U.S. Application Data

(60) Provisional application No. 63/229,842, filed on Aug. 5, 2021.

(51) Int. Cl.
*H01L 25/065* (2023.01)
*H01L 23/367* (2006.01)

(52) U.S. Cl.
CPC ...... *H01L 25/0657* (2013.01); *H01L 23/3672* (2013.01); *H01L 23/3675* (2013.01); *H01L 2225/06513* (2013.01); *H01L 2225/06517* (2013.01); *H01L 2225/06541* (2013.01); *H01L 2225/06589* (2013.01)

(58) Field of Classification Search
CPC ............ H01L 25/0657; H01L 23/3672; H01L 23/3675
See application file for complete search history.

(56) References Cited

U.S. PATENT DOCUMENTS

| 4,549,036 A | 10/1985 | Reichbach |
| 8,136,071 B2 | 3/2012 | Solomon |
| 8,172,156 B2 | 5/2012 | Vafai et al. |

(Continued)

FOREIGN PATENT DOCUMENTS

| EP | 1628515 B1 | 9/2007 |
| EP | 1827070 B1 | 10/2017 |
| WO | 2009037648 A2 | 3/2009 |

OTHER PUBLICATIONS

Desai, C.P., Vafai, K., and Keyhani, M., 1995, "On the Natural Convection in a Cavity with a Cooled Top Wall and Multiple Protruding Heaters," ASME J Electronic Packaging, 117, 34-45.

(Continued)

*Primary Examiner* — Thao P Le
(74) *Attorney, Agent, or Firm* — Ortiz & Lopez, PLLC; Kermit D. Lopez; Luis M. Ortiz

(57) ABSTRACT

A 3D integrated circuit device can include a substrate, a thermal interface layer and at least one die, at least one device layer bonded between the thermal interface layer and the at least one die, wherein the thermal interface layer enhances conductive heat transfer between the at least one device layer and the at least one die, and a heat sink located adjacent to a heat spreader, wherein the thermal interface layer, the at least one die and the at least one device layer are located between the heat spreader and the substrate.

20 Claims, 16 Drawing Sheets

(56) References Cited

U.S. PATENT DOCUMENTS

| | | | |
|---|---|---|---|
| 8,684,274 B2 | 4/2014 | Vafai et al. | |
| 8,814,057 B2* | 8/2014 | Vafai | B82Y 30/00 165/81 |
| 9,263,374 B2 | 2/2016 | Masuda et al. | |
| 9,472,485 B2 | 10/2016 | Saeidi et al. | |
| 9,666,562 B2 | 5/2017 | Law et al. | |
| 9,954,080 B2 | 4/2018 | Or-Bach et al. | |
| 10,976,789 B2 | 4/2021 | Ghosh | |
| 11,018,133 B2 | 5/2021 | Or-Bach et al. | |
| 11,037,860 B2 | 6/2021 | Hoffmeyer et al. | |
| 11,043,553 B2 | 6/2021 | Kim et al. | |
| 11,147,982 B1* | 10/2021 | Vafai | A61N 2/006 |
| 2004/0190245 A1* | 9/2004 | Tirumala | F28F 1/16 257/E23.099 |
| 2006/0011336 A1* | 1/2006 | Frul | F28F 21/02 165/185 |
| 2008/0281476 A1 | 11/2008 | Bose et al. | |
| 2012/0025388 A1 | 2/2012 | Law et al. | |
| 2012/0168128 A1 | 7/2012 | Vafai et al. | |
| 2013/0118711 A1 | 5/2013 | Vafai et al. | |
| 2015/0010037 A1 | 1/2015 | Vafai et al. | |
| 2015/0237762 A1 | 8/2015 | Holt et al. | |
| 2021/0043996 A1 | 2/2021 | Menon et al. | |
| 2023/0024390 A1* | 1/2023 | Amalfi | H01L 23/34 |
| 2023/0032968 A1* | 2/2023 | Shirato | H01L 23/373 |
| 2023/0033173 A1* | 2/2023 | Or-Bach | H10B 63/30 |
| 2023/0037442 A1* | 2/2023 | Matioli | H01L 23/473 |
| 2023/0041344 A1* | 2/2023 | Or-Bach | H01L 25/0657 |
| 2023/0043794 A1* | 2/2023 | Winzer | G02B 6/0085 |
| 2023/0048534 A1* | 2/2023 | Vafai | H01L 23/3672 |
| 2023/0065309 A1* | 3/2023 | Faulkner | G06K 7/10297 |

OTHER PUBLICATIONS

Mahjoob, S., and Vafai, K., 2009, "Analytical Characterization and Production of an Isothermal Surface for Biological and Electronic Applications," ASME J Heat Trans, 131, 052604.

Sparrow, E., Gorman, J., and Abraham, J.,2013, "Quantitative Assessment of the Overall Heat Transfer Coefficient U," ASME J Heat Trans, 135(6), 061102.

Sparrow, E.M., Abraham, J.P, and Chevalier, P.W., 2005, "A DOS-enhanced numerical simulation of heat transfer and fluid flow through an array of offset fins with conjugate heating in the bounding solid," ASME J Heat Trans, 127 (1), pp. 27-33.

Haji-Sheikh, A., Minkowycz, W.J., and Sparrow, E.M., 2002, "Certain anomalies in the analysis of hyperbolic heat conduction," ASME J Heat Trans, 124 (2), pp. 307-319.

Sparrow, E.M., and Ansari, M.A., 1987, "Effect of insulated/uninsulated channel walls on heat transfer from a horizontal finned tube in a vertical channel,", ASME J Heat Trans, 109 (2), pp. 388-391.

Kang, S.S., and Sparrow, E.M., 1987, "Heat transfer from an open- or closed-bore cylinder situated longitudinal to a freestream," ASME J Heat Trans, 109 (2), pp. 314-320.

Samie, F., and Sparrow, E.M.,1986, "Heat transfer from a yawed finned tube," ASME J Heat Trans, 108 (2), pp. 479-482.

Kearney, D., and Griffin, J., 2014, "An open loop pulsating heat pipe for integrated electronic cooling applications," ASME J Heat Trans, 136 (8), 081401.

Nakayama, W., 2014, "Heat in computers: applied heat transfer in information technology," ASME J Heat Trans, 136 (1), 013001, (2014).

Herwig, H., 2013, "High heat flux cooling of electronics: the need for a paradigm shift", ASME J Heat Trans, 135 (11), 111013.

Arik, M., Sharma, R., Lustbader, J., and He X., 2013, "Steady and unsteady air impingement heat transfer for electronics cooling applications,", ASME J Heat Trans, 135 (11), 111009.

Molki, M., and Sparrow, E.M.,1986, "An empirical correlation for the average heat transfer coefficient in circular tubes," ASME J Heat Trans, 108 (2), pp. 482-484.

Chrysler, G.M., and E.M. Sparrow, 1986, "Turbulent flow and heat transfer in bends of circular cross Section: II—Pressure distribution experiments," ASME J Heat Trans, 108 (1), pp. 212-216.

Kadle, D.S ., and Sparrow, E.M., 1986, "Numerical and experimental study of turbulent heat transfer and fluid flow in longitudinal fin arrays," ASME J Heat Trans, 108 (1), pp. 16-23.

Sparrow, E.M., and Chrysler, G.M., 1986, "Turbulent flow and heat transfer in bends of circular cross section: I—Heat transfer experiments," ASME J Heat Trans, 108 (1), pp. 40-47.

Azari, M., Sadeghi, A., and Dejam, M., 2020, "Liquid flow forced convection in rectangular microchannels with nonuniform heating: Toward analytical modeling of hotspots," ASME J Heat Trans, 142 (8), 082505.

Colla, L., Ercole, D., Fedele, L., Mancin, S., Manca, O., and Bobbo, S.,2017, "Nano-phase change materials for electronics cooling applications," ASME J Heat Trans, 139 (5), 052406.

Gielen, R., and Baelmans, M., 2014, "Electronics cooling system and component design according to the second law," ASME J Heat Trans, 136 (5).

Vafai, K., and Zhu, L.,1999, "Analysis of a Two-Layered Microchannel Heat Sink Concept in Electronic Cooling," J of Heat and Mass Transfer, 42, pp. 2287-2297.

Lu, S., and Vafai, K., 2016, "A Comparative Analysis of Innovative Microchannel Heat Sinks for Electronic Cooling," International Communications in Heat and Mass Transfer,76, pp. 271-284, http://dx.doi.org/10.1016/j.icheatmasstransfer.2016.04.024.

Zing, C., Mahjoob, S., and Vafai, K., 2019, "Analysis of Porous Filled Heat Exchangers for Electronic Cooling," J of Heat and Mass Transfer, 133, pp. 268-276, https://doi.org/10.1016/j.ijheatmasstransfer.2018.12.067.

Dirker, J., and J.P Meyer. J., 2013, "Topology optimization for an internal heat-conduction cooling scheme in a square domain for high heat flux applications," ASME J Heat Trans, 135 (11), 111010.

Sirisha Maganti, L., Dhar, P., Sundararajan, T.,and Das, S.K., 2017, "Selecting Optimal Parallel Microchannel Configuration(s) for Active Hot Spot Mitigation of Multicore Microprocessors in Real Time," ASME J Heat Trans , 139 (10), 102401.

Shen, Z., Jing, Q., Xie, Y., and Zhang, D., 2017, "Thermal Performance of Miniscale Heat Sink with Jet Impingement and Dimple/Protrusion Structure," ASME J Heat Trans, 139 (5), 052202.

Banerjee, K., Souri. S., Kapur, P., and Saraswat, K. C.,2001, "3-D ICs: A novel chip design for improving deep submicron interconnect performance and system-on-chip integration." IEEE, Special Issue on Interconnects.

Joyner, J. W., Zarkesh-Ha, P., Davis, J. A., and Meindl, J. D.,2000, "A three-dimensional stochastic wire-length distribution for variable separation of strata," IEEE, pp. 126-128.

Im, S., and Banerjee, K., 2000, "Full chip thermal analysis of planar (2-D) and vertically integrated (3-D) high-performance ICs," IEDM, Technical Digest, pp. 727-730.

Tavakkoli, F., Ebrahimi, S., Wang, S., and Vafai, K., 2016, "Analysis of critical thermal issues in 3D integrated circuits," J Heat and Mass Transfer 97, pp. 338-352.

Banerjee, K., Amerasekera, A., Dixit, G., and Hu, C.,1996, "The effect of interconnect scaling and low-k dielectric on the thermal characteristics of the IC metal," IEDM Tech. Dig., pp. 65-68.

Goodson, K. E., and Ju, Y. S., 1999, "Heat conduction in novel electronic films," Annu. Rev. Mater. Sci., 29, pp. 261-293.

Banerjee, K., Souri, S.J., Kapur, P., and Saraswat, K.C., 2001 "3-D ICs: a novel chip design for improving deep-submicrometer interconnect performance and systems-on-chip integration," IEEE 89 (5) pp. 602-633.

Coskun, A.K., Ayala, J.L., Atienza, D., Rosing, T.S., and Leblebici, Y.,2009, "Dynamic thermal management in 3D multicore architectures," Conference & Exhibition of Design, Automation & Test in Europe, pp. 1410-1415.

Tavakkoli, F., Ebrahimi, S., Wang, S., and Vafai, K., 2016, "Thermophysical and Geometrical Effects on the thermal performance and Optimization of a three-Dimensional Integrated Circuit," ASME J Heat Trans, pp. 082101-1-082101-7.

Rocha, L.A.O., Lorente, S., and Bejan, A., 2002, "Constructal design for cooling a disc-shaped area by conduction," Int J Heat Mass Transf. 45, pp. 1643-1652.

(56) References Cited

OTHER PUBLICATIONS

Rocha, L.A.O., Lorente, S., and Bejan, A., 2006, "Conduction tree networks with loops for cooling a heat—generating volume," J Heat Mass Transf, 49, pp. 2626-2635.

Da Silva, A. K., Vasile. C., and Bejan, A., 2004, "Disc cooled with high-conductivity inserts that extend inward from the perimeter," J Heat Mass Transf, 47, pp. 4257-4263.

Ghodoossi, L., and Egrican, N., 2003, "Exact solution for cooling of electronics using constructal theory," J Appl Phys., 93, pp. 4922-4929.

Sharifi, F., Ghaedamini, H., and Salimpour, M. R.,2012, "Using incomplete variable cross-section highly conductive inserts for cooling a disc," Front Heat Mass Transf, 3,043005.

Nazari, B., Salimpour, M. R., and Mahjoub, S., 2019, "Optimal mechanical and thermal architecture of high-conductivity inserts for cooling an electronic piece," J of Therm Analy Calorim, pp. 1499-1514.

Wang, C., Huang, X.-J., Vafai, K.,2020, "Analysis of hotspots and cooling strategy for multilayer three-dimensional integrated circuits," Appl Therm Eng, https://doi.org/10.1016/j.applthermaleng.2020.116336.

M.I Flik and C.L. Tien, "Size Effect on the Thermal Conductivity of High-Tc Thin-Film Superconductors", ASME, 872 /vol. 112, Nov. 1990.

Masoud Daneshi, Marjan Zare, and Mohammad Reza Salimpour, "Micro- and Nanoscale Conductive Tree-Structures for Cooling a Disk-Shaped Electronic Piece", Journal of Heat Transfer, ASME, Mar. 2013, vol. 135 / 031401-1.

Ephraim M. Sparrow, Paul W. Chevalier, and John P. Abraham, "The Design of Cold Plates for the Thermal Management of Electronic Equipment", Heat Transfer Engineering, 27(7):6-16, 2006.

Md Arif Iqbal, Naveen Kumar Macha, Wafi Danesh, Sehtab Hossain, Mostafizur Rahman, "Thermal Management in Fine-Grained 3-D Integrated Circuits", 2018, https://arxiv.org/abs/1803.03727.

"Three-dimensional integrated circuit", Wikipedia, Retrieved from "https://en.wikipedia.org/w/index.php?title=Three-dimensional_integrated_circuit&oldid=1026254022"; Page last edited on Jun. 1, 2021, at 06:53 (UTC).

\* cited by examiner

THERMAL MANAGEMENT OF THREE-DIMENSIONAL INTEGRATED CIRCUITS

CROSS REFERENCE TO PROVISIONAL APPLICATION

This patent application claims priority under 35 U.S.C. § 119 to U.S. Provisional Patent Application Ser. No. 63/229,842 entitled "Thermal Management of Three-Dimensional Integrated Circuits," which was filed on Aug. 5, 2021, and is incorporated by reference herein in its entirety.

TECHNICAL FIELD

Embodiments are related to integrated circuits. Embodiments are also related to the thermal management of integrated circuits. Embodiments further relate to three-dimensional (3D) integrated circuits.

BACKGROUND

Achieving thermal management is an important need in the advancement of microelectronic components. As the number of devices mounted on a single chip increases, appropriate thermal management is becoming of paramount concern. Thermal issues have a crucial impact on the functionality and reliability of electronic systems.

Recent advances in the electronics industry have paved the way for various innovative schemes to be proposed and implemented for potentially addressing the overheating issues. For example, some approaches have attempted to model analytically the hotspots of a nonuniform heated body when rectangular microchannels were invoked to dissipate the generated heat. In other approaches, nano-phase change materials have been used to mitigate the high temperatures resulting in the electronic parts.

Thermal management is vital in the design of 2D (two-dimensional) and 3D (three-dimensional) integrated circuit (IC) technologies since the thermal conductivity of dielectric materials is low, which can result in thermal hotspots throughout the component. Furthermore, the increased power density in 3D integrated circuits leads to ever more crucial thermal issues that can directly affect their performance. 3D integrated circuits can provide a venue for achieving higher circuit performance and on-chip integration of analog, digital, and mixed-signal circuits simultaneously. Resistive-capacitive delay is one of the drawbacks of the 2D integrated circuit. To overcome this issue, 3D IC architectures may be utilized. An advantage of this system is its suitability for usage for System-on-a-Chip designs. There have been a limited number of investigations of the thermal aspect of 3D integrated circuits.

A three-dimensional integrated circuit (3D IC) can be implemented as an integratead circuit manufactured by stacking silicon wafers or dies and interconnecting them vertically using, for example, through-silicon vias (TSVs) or Cu—Cu connections, so that they can behalf as a single device to achieve performance improvements at a reduced power and with a smaller footprint than conventional 2D (two-dimensional) processes/devices. The 3D IC is one of several 3D integration schemes that can exploit the z-direction to achieve electrical performance benefits in microelectronics and nanoelectronics. However, as discussed above, thermal management issues in 3D devices and systems remains a problem.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved integrated circuit.

It is another aspect of the disclosed embodiments to provide the thermal management of integrated circuits.

It is a further aspect of the disclosed embodiments to provide for an improved 3D integrated circuit.

It also an aspect of the disclosed embodiments to provide for the design and optimization of a composition heat spreader to improve the thermal management of a 3D integrated circuit.

It is a further aspect of the disclosed embodiments to provide for the geometrical optimization of inserts embedded in a heat spreader to improve its cooling performance for 3D integrated circuits.

The aforementioned aspects and other objectives and advantages can now be achieved as described herein. In an embodiment, a 3D integrated circuit device, can include a substrate, a thermal interface layer and at least one die, at least one device layer bonded between the thermal interface layer and the at least one die, wherein the thermal interface layer enhances conductive heat transfer between the at least one device layer and the at least one die; and a heat sink located adjacent to a heat spreader, wherein the thermal interface layer, the at least one die and the at least one device layer are located between the heat spreader and the substrate.

In an embodiment of the 3D integrated circuit device, the heat sink can include a coolant entrance and at least one coolant exit, wherein a coolant enters the heat sink through the coolant entrance and exits the heat sink through the at least one coolant exit.

In an embodiment of the 3D integrated circuit device, the at least one device layer can include at least one electronic subsystem.

In an embodiment of the 3D integrated circuit device, the at least one electronic subsystem can comprise at least one of: a processor, a memory, and a sensor.

In an embodiment of the 3D integrated circuit device, the heat spreader can comprise a high conductivity insert.

In an embodiment of the 3D integrated circuit device, the high conductivity insert can comprise Boron Arsenide.

An embodiment of the 3D integrated circuit device can include a blade configuration.

An embodiment of the 3D integrated circuit device can include comprising a ring configuration.

In an embodiment of the 3D integrated circuit device, the substrate, the thermal interface layer, the at least one die, the at least one device layer, the heat spreader, and the heat sink can be arranged on top of each other while the high conductivity inserts can be arranged in the ring configuration.

In an embodiment of the 3D integrated circuit device, the ring configuration can comprise a single layer ring configuration.

In an embodiment of the 3D integrated circuit device, the ring configuration can comprise a double layer ring configuration.

In an embodiment of the 3D integrated circuit device, the thermal interface layer can comprise C4 bumps that can connect the substrate and the at least one die closest to the substrate.

In an embodiment of the 3D integrated circuit device, the thermal interface layer further can comprise micro-bumps for bonding the at least one device layer to at least one layer above the at least one device layer.

In an embodiment of the 3D integrated circuit device, heat generated in the at least one electronic subsystem can be conducted through the thermal interface layer to the heat sink.

In an embodiment of the 3D integrated circuit device, the size of the heat spreader can be the same size as a size of thermal interface layer and the size of the at least one device layer.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
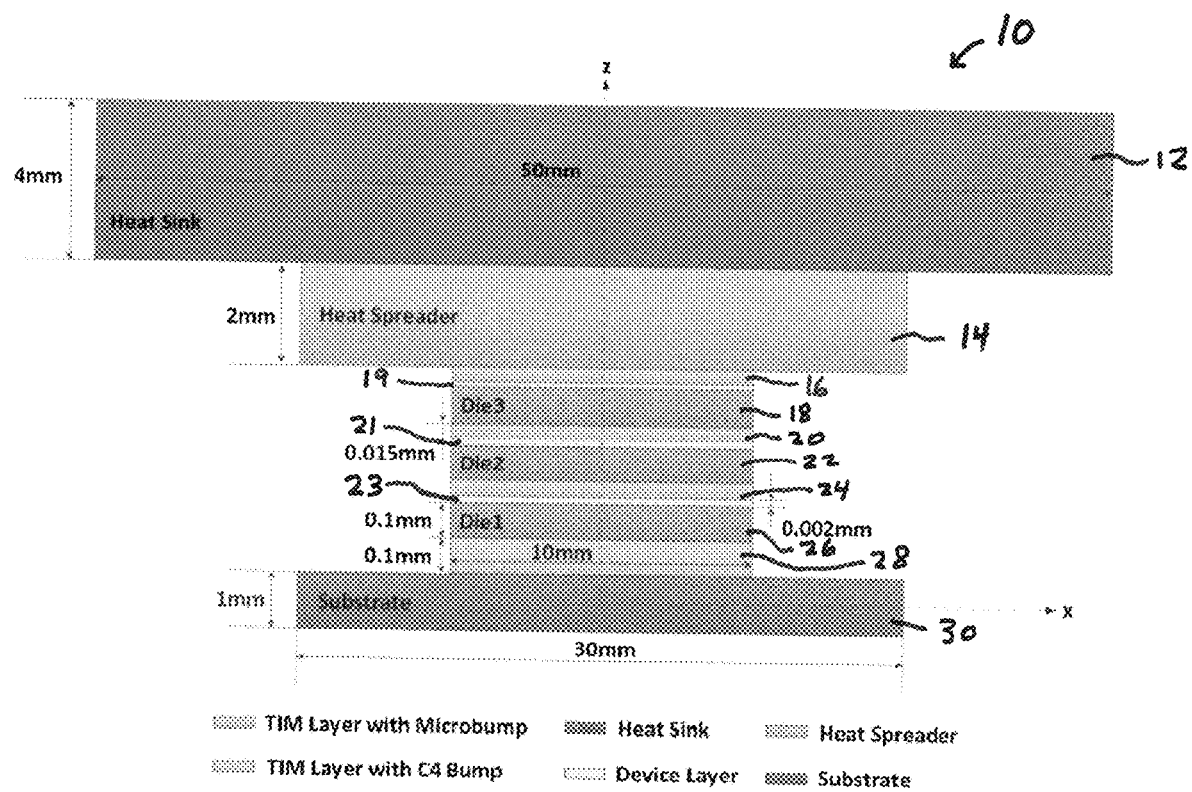
FIG. 1 illustrates a schematic diagram of the structure of a three-dimensional IC comprising a substrate, thermal interface material (TIM), die, device layer, heat spreader, and heat sink, in accordance with an embodiment.

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware, or any combination thereof (other than software per se). The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein do not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part. In addition, identical reference numerals utilized herein with respect to the drawings can refer to identical or similar parts or components.

In general, terminology may be understood, at least in part, from usage in context. For example, terms such as "and," "or," or "and/or" as used herein may include a variety of meanings that may depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The embodiments can be based at least in part on the analysis of the optimal distribution of a limited amount of high thermal conductivity material to enhance the heat removal of circular 3D integrated circuits, IC. The structure of a heat spreader, for example, can be designed as a composite of high thermal conductivity (e.g., Boron Arsenide) and moderate thermal conductivity (e.g., copper) materials. The volume ratio of high-conductivity inserts to the total volume of the spreader ca be set at a fixed pertinent ratio. Two different boundary conditions of constant and variable temperature can be considered for the heat sink. To examine the impact of adding high-conductivity inserts on the cooling performance of the heat spreader, various patterns of the single and double ring inserts can be studied. In some cases, a parametric study may be performed to find the optimal location of the rings. Moreover, the optimal distribution of the high-conductivity material between the inner and outer rings may be found. Results have shown that for the optimal conditions, the maximum temperature of the 3D IC can be reduced up to 10%; while the size of the heat sink, and heat spreader without HCl can be 200% larger than the recommended HCl embedded configuration.

Note that in some embodiments, the generated heat throughout device layers can be transferred via conduction to a heat sink through a heat spreader. In a typical situation, the heat sink and the heat spreader may be larger than the electronic component.

FIG. 1 illustrates a schematic diagram of the structure of a three-dimensional integrated circuit device 10 comprising a substrate 28, one or more thermal interface material (TIM) layers, one or more die, one or more device layers, a heat spreader 14, and a heat sink 12, in accordance with an embodiment. The TIM layers can include a TIM layer 16, a TIM layer 20, and a TIM layer 24. Each of the TIM layer 16, the TIM layer 20, and the TIM layer 24 can be configured as a TIM layer with a microbump. The TIM layers can also include a TIM layer 28 that can be configured as a TIM layer with a C4 bump. The device layers can include a device layer 19, a device layer 21, and a device layer 23. The 3D IC device 10 further includes one or more die include a first die 26, a second die 22, and a third die 18, respectively also shown in FIG. 1 as Die 1, Die 2, and Die 3.

In the embodiment shown in FIG. 1, the heat sink 12 is shown as having a length of 50 mm and a width or height of 4 mm. The heat spreader is indicated as having width or height of 2 mm. It can be appreciated that the various dimensions shown and described herein with respect to FIG. 1 and elsewhere in this disclosure are not considered limiting features of the embodiments. The dimensions discussed and illustrated herein are provided for exemplary purposes only.

The schematic of a generalized three-dimensional IC structure for the 3D IC device 10 is thus shown in FIG. 1. This structure can be composed of the substrate 30, the TIM layers 16, 20, 24 and 30, the group of die including the first die 26, the second die 22, and the third die 18. The structure of the 3D IC device 10 can also include the device layer 19, the device layer 21, the device layer 23, the heat spreader 14 and the heat spreader 12.

The device layers 19, 21, and 23 can be mounted between the TIM layers 16, 20, 24 and the silicon die 18, 22, and 26. For example, the device layer 19 can be located between the TIM layer 16 and the die third die 18. The device layer 21 can be located between the TIM layer 20 and the second die 22. The device layer 23 can be located between the TIM layer 24 and the first die 26. The TIM layer 28 can be adjacent or proximate to the substrate 30.

Various electronic subsystems can be located in the device layers 19, 21, 23 such as a processor, a memory, a sensor, and so on. It should be noted that heat generation merely occurs inside the device layers 19, 21, 23. The thermal interface material of the TIM layers can be used to enhance conductive heat transfer between the device layers 19, 21, 23 and the first die 26, the second die 22, and the third die 18 so that the insulating effect of the air cavities created at the contact surface of the two solid layers can be minimized.

The TIM layer can include C4 bumps used to connect the silicon substrate and the die closest to it, while micro-bump TIM layers can be utilized for bonding the device layers with the layer above it. The heat generated in each CPU due to transistor switching can be conducted through the layers to the package and then dissipated to the ambient via convective heat transfer.

Nominal values for different components of the 3D IC that can be considered are given in Table 1. Silicon is a preferred material used for fabricating electronic chips due to its stability, abundance, and ease of fabrication, while copper is preferred for manufacturing the heat sink and the heat spreader components due to its superior thermal conductivity. The TIM layers that can provide electrical insulation and mechanical support for the bonding of active device layers, are typically made out of composites with high volume fractions of thermally conductive fillers such as aluminum oxide. The variation of pertinent components utilized in the 3D architecture and the generated heat is given in Table 1.

The size of the heat spreader and heat sink can be larger than other layers to extend the surface area exposed to the cooling fluid and to enhance the heat transfer to the ambient fluid. If there is a space constraint, however, their cooling performance will be impaired. Simulations by the present inventors have shown that restricting the diameter of the heat spreader decreases the cooling capability of the heat sink. To overcome this problem, a rather limited and practical amount of a high conductivity material can be used to boost the thermal conductance of the heat spreader. Therefore, we can seek an optimal distribution of the limited amount of high conductivity materials through the heat spreader to enhance the heat removal of circular 3D integrated circuits.

For this purpose, the impact of adding high-conductivity inserts, various patterns of single and double ring styles on the cooling performance of the heat spreader can be studied. This can include, first a parametric study to find the optimal location of the rings. Then, we can turn our attention to finding the optimal distribution of the high-conductivity material between the inner and outer rings.

The volume ratio of the high-conductivity inserts to the total volume of the heat spreader may be fixed at 20%. We have shown that changing the percentage of the high conductivity material does not change the characteristic of the results illustrated in this work.

Two different boundary conditions for the heat sink can be considered. The constant temperature at 15° C.; and linear variable temperature (15-25° C.). These are based on pertinent conditions experienced by the 3D ICs.

An example of a heat spreader material that may be utilized to implement the heat spreader 14 in one example embodiment can be copper with k=401 W(mK)-1, while the high conductivity material may be taken as boron arsenide with thermal conductivity of 1300 W(mK)-1. In an embodiment, high conductivity inserts can be assumed to be rings. Also, when we use a double ring configuration, the high conductivity material can be split between the rings equally unless mentioned otherwise. The thickness of the inserts can be similar to that of the heat spreader.

To show the significance of the disclosed embodiments, the following cases (without HCl) can be first investigated.
   a) A 3D IC with a heat spreader diameter of 30 mm for constant boundary condition.
   b) A 3D IC with a heat spreader diameter of 10 mm (equal to the diameter of the main piece) for the same boundary condition.

The results show that for the first and second boundary conditions, the maximum temperatures for case b are 1.1 and 8.6 C higher than that of the case a, respectively. This highlights the importance of invoking the proposed configuration especially when the size of the heat sink may be limited.

Figure 2:
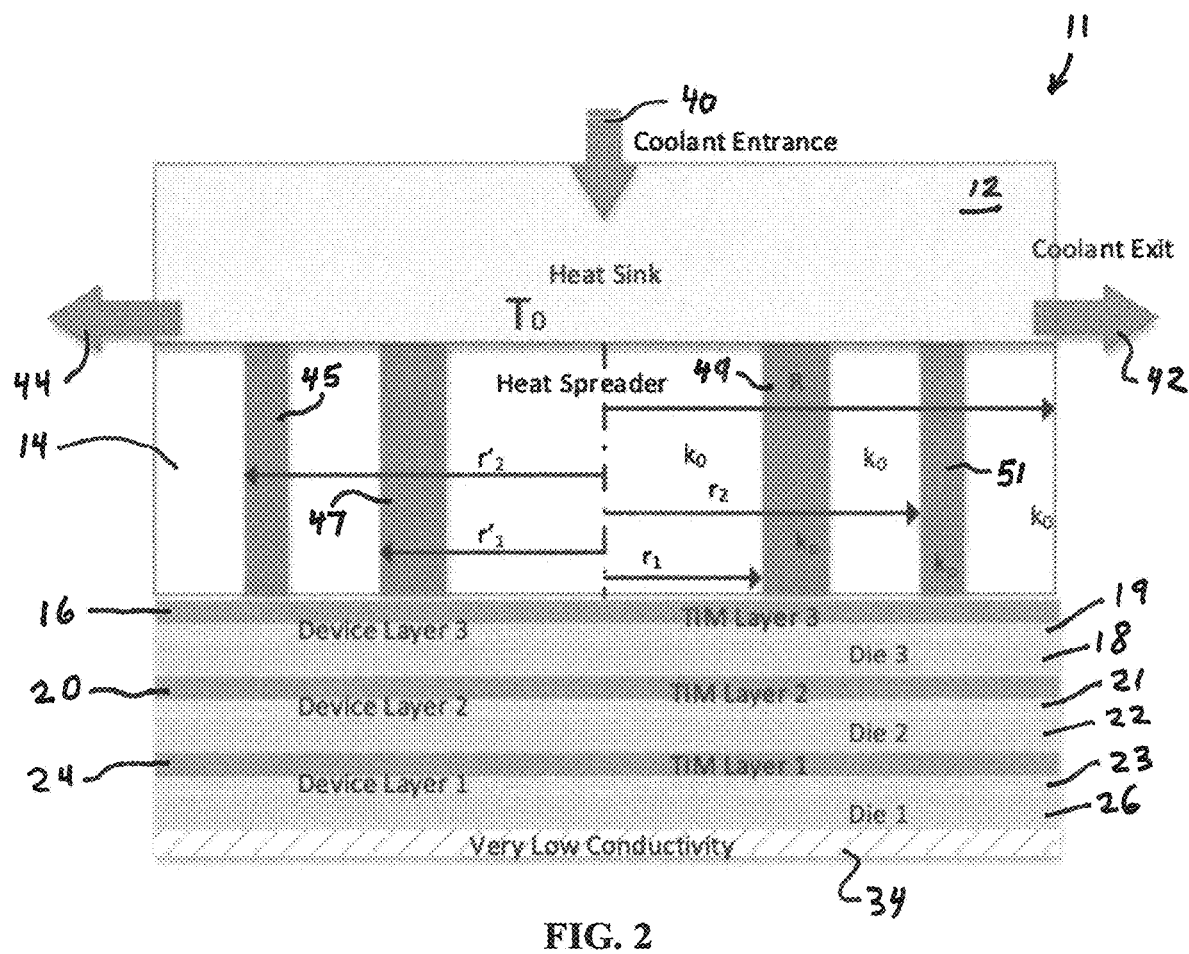
FIG. 2 illustrates a schematic diagram of a 3D IC structure with double-ring high-conductivity inserts within the heat spreader, in accordance with an embodiment.

FIG. 2 illustrates a schematic diagram of a structure of a 3D IC device 11 having double-ring(s) high-conductivity inserts 45, 47 and 49, 51 within the heat spreader 14, in accordance with an embodiment. Note that similar parts or elements shown in FIG. 1 and FIG. 2 and elsewhere herein refer to similar or identical parts or elements. The 3D IC device 11 depicted in FIG. 2 represents an alternative embodiment with respect to the 3D IC device 10 shown in FIG. 1. In the configuration of the 3D IC device 11 depicted in FIG. 2, a coolant entrance 40, a coolant exit 42, and a coolant exit 44 are depicted with respect to the heat sink 12. A very low conductivity region 34 is also depicted in FIG. 2 below or adjacent to a die 26 (also shown as Die 1 in FIG. 2).

The 3D IC device 11 shown in FIG. 2 is a 3D integrated circuit device that can include a substrate (not shown in FIG. 2) such as the substrate 30 of FIG. 1 and one or more TIM layers 16, 20, 24, and one or more die 18, 22, 26 (also respectively labeled as Die 3, Die 2, and Die 1 in FIG. 2). The device layers 19, 21, and 23 can be bonded between the TIM layers 16, 20, 24 and the die 18, 22, 26. The TIM layers 16, 20, 24 can enhance conductive heat transfer between the device layer(s) and the die. The heat sink 12 can be located adjacent to the heat spreader 14, and the thermal interface layer, the die and the device layers can be located between the heat spreader 14 and the substrate 30.

The heat spreader 14 can include one or more high conductivity inserts such as the inserts 45, 47 and 49, 51. In some embodiments, the high conductivity inserts 45, 47 and 49, 51 may comprise or may be configured from Boron Arsenide. In some embodiments, the 3D IC (also referred to as a 3D IC device) 11 be configured with a blade configuration and/or a ring configuration. Such a ring configuration may be a single layer ring configuration or a double layer ring configuration. Furthermore, in some embodiments, the thermal interface layer can include C4 bumps (e.g., see TIM layer 29 in FIG. 1) that can connect the substrate and the die closest to the substrate. In addition, a thermal interface layer such as the TIM layers 16, 20, and 24 may include microbumps for bonding the device layer(s) to at least one layer above a device layer Heat generated in one or more of the electronic subsystems can be conducted through the thermal interface layers to the heat sink 12. Note that the term 'thermal interface layer' and 'TIM layer' as utilized interchangeably to refer to the same component or feature.

FIG. 2 depicts a composite heat spreader 14 utilizing a composite having a double layer that configured based on, for example, the parameters shown in Table 1. The nominal specifications for different layers for the 3D IC device 11 considered may be as shown in Table 1.

| Layer | Parameter | Nominal values | Unit |
|---|---|---|---|
| Heat spreader | Material | Cu | — |
| | Diameter | 10, 30 | mm |
| | Thickness | 2 | mm |
| Chip | Diameter | 10 | mm |
| | Number of layers | 3 | — |
| TIM layer with microbump | TIM material | Thermal grease | — |
| | Thermal conductivity | 5 | W(mK)$^{-1}$ |
| | Thickness | 15 | μm |
| TIM layer with C4 bump | TIM material | Thermal grease | — |
| | Thermal conductivity | 5 | W(mK)$^{-1}$ |
| | Thickness | 100 | μm |
| Die | Material | Si | — |
| | Thickness | 100 | μm |
| Device layer | Material | Si | — |
| | Thickness | 2 | μm |
| Core processor | Material | Si | — |
| | Total power of cores in each layer | 90 | W |
| | Cores per layer | 4 | — |
| | Diameter | 1 | mm |
| | Thickness | 2 | μm |
| Substrate | Material | Si | — |
| | Diameter | 30 | mm |
| | Thickness | 1 | mm |

The various parameters and values shown in Table 1 are presented herein for illustrative and exemplary purposes only and are not considered limiting features of the disclosed embodiments.

The energy transport throughout the 3D IC device 11 occurs via conduction with convection at the outer boundaries. The three-dimensional, steady-state governing equation in the cartesian coordinate system can be written as, $$\frac{\partial^2 T^*}{\partial x^{*2}} + \frac{\partial^2 T^*}{\partial y^{*2}} + \frac{\partial^2 T^*}{\partial z^{*2}} + \dot{q}_g^* = 0 \qquad (1)$$

where $\dot{q}_g^*$ denotes the volumetric heat generation inside each piece. This term is non-zero in the heat generating layers. The nondimensionalized coordinates, volumetric heat generation, and temperature and coordinates are $$x^* = \frac{x}{H}, x^* = \frac{y}{H}, z^* = \frac{z}{H}, \qquad (2)$$

$$\dot{q}_g^* = \frac{\dot{q}_g H^2}{k(T_{max,0} - T_0)} \qquad (3)$$

$$T^* = \frac{T - T_0}{T_{max,0} - T_0} \qquad (4)$$

The boundary conditions for all the external surfaces of the 3D IC device 11 except the heat sink is effectively akin to an adiabatic condition due to the low thermal conductivity. Two relevant boundary conditions for the heat sink are considered as:

First B.C.: $T_0 = 15[°C.]$ (5)

Second B.C.: $T_0 = 10\left(\dfrac{r}{R}\right) + 15[°C.]$ (6)

where in the non-dimensional form, they can be written as

First B.C.: $T_0^* = 0$ (7)

Second B.C.: $T_0^* = \dfrac{10r^*}{T_{max,0} - T_0} = \dfrac{10r^*}{62.7 - 15} = 0.21r^*$ (8)

There is natural convection around the 3D IC. The B.C. at the peripherical surface of the IC is stated in the following non-dimensional form:

$$\dfrac{\partial T_s^*}{\partial n} = -Bi(T_s^* - T_\infty^*)$$ (9)

where n is the normal coordinate and Bi is the dimensionless Biot number defined as:

$$Bi = \dfrac{hR}{k}$$ (10)

and $T_\infty$, is the ambient temperature ($T_\infty=300$ K).

To model the natural convection around the 3D IC, the continuity, Navier-Stokes, and energy equations are solved. These equations are given below in Cartesian coordinates.

Continuity Equation:

$$\dfrac{\partial u^*}{\partial x^*} + \dfrac{\partial v^*}{\partial y^*} + \dfrac{\partial w^*}{\partial z^*} = 0$$ (11)

x-momentum conservation equation $$Re_H\left(u^*\dfrac{\partial u^*}{\partial x^*} + v^*\dfrac{\partial u^*}{\partial y^*} + w^*\dfrac{\partial u^*}{\partial z^*}\right) = -\dfrac{\partial p^*}{\partial x^*} + \left(\dfrac{\partial^2 u^*}{\partial x^{*2}} + \dfrac{\partial^2 u^*}{\partial y^{*2}} + \dfrac{\partial^2 u^*}{\partial z^{*2}}\right)$$ (12)

y-momentum conservation equation $$Re_H\left(u^*\dfrac{\partial v^*}{\partial x^*} + v^*\dfrac{\partial v^*}{\partial y^*} + w^*\dfrac{\partial v^*}{\partial z^*}\right) = -\dfrac{\partial p^*}{\partial y^*} + \left(\dfrac{\partial^2 v^*}{\partial x^{*2}} + \dfrac{\partial^2 v^*}{\partial y^{*2}} + \dfrac{\partial^2 v^*}{\partial z^{*2}}\right)$$ (13)

z-momentum conservation equation $$Re_H\left(u^*\dfrac{\partial w^*}{\partial x^*} + v^*\dfrac{\partial w^*}{\partial y^*} + w^*\dfrac{\partial w^*}{\partial z^*}\right) = -\dfrac{\partial p^*}{\partial z^*} + \left(\dfrac{\partial^2 w^*}{\partial x^{*2}} + \dfrac{\partial^2 w^*}{\partial y^{*2}} + \dfrac{\partial^2 w^*}{\partial z^{*2}}\right)$$ (14)

energy conservation equation:

$$Pe_H\left(u^*\dfrac{\partial T^*}{\partial x^*} + v^*\dfrac{\partial T^*}{\partial y^*} + w^*\dfrac{\partial T^*}{\partial z^*}\right) = \left(\dfrac{\partial^2 T^*}{\partial x^{*2}} + \dfrac{\partial^2 T^*}{\partial y^{*2}} + \dfrac{\partial^2 T^*}{\partial z^{*2}}\right)$$ (15)

The governing equations were nondimensionalized as follows:

$$u^* = \dfrac{u}{u_m}; v^* = \dfrac{V}{u_m}; w^* = \dfrac{w}{u_m}; p^* = \dfrac{pH}{\mu_f u_m}; Re_H = \dfrac{\rho_f u_m H}{\mu_f}; Pe = \dfrac{\rho_f C_{p,f} u_m H}{k_f}$$ (16)

To extend the application of the results of this study, the following dimensionless variables are defined and used in this study.

$$r^* = r/R; z^* = z/L; \phi = \dfrac{V_{HCl}}{V_{Spreader}}; P = \dfrac{V_{HCl1}}{V_{HCl2}}$$ (17)

where, $r^*$, $z^*$, $\phi$, and P are dimensionless radius, dimensionless height, volume fraction, and volume ratio, respectively. Volume ratio shows how much HCL is allocated to the inner and outer rings, in the double-ring configuration. The value of the volume fraction is fixed at 0.2 throughout this study.

Dimensionless Temperature can be defined as $$T_{max}^* = \dfrac{T_{max} - T_0}{T_{max,0} - T_0}$$ (18)

Where, $T_0$ designates the minimum temperature of the heat sink (Temperature of Heat Sink Center, 15° C.), $T_{max}$ is the maximum temperature of the 3D IC with composite heat spreader (with high conductivity insert), and $T_{max,0}$ is the maximum temperature of the 3D IC with plain heat spreader (without high conductivity insert). This dimensionless variable shows the effectiveness of utilizing HCl in cooling the 3D IC. According to this definition, $T_{max}^*$ is always less than unity.

A finite volume method is set up for this work. Convergence is achieved when the residuals of energy equations become less than $10^{-8}$. To check the grid independence, the number of grids is doubled until a deviation of less than 1% is observed in the minimum temperature for the last two sets of grid distributions. Four grid distributions have been created for this study which is shown in Table 2. The minimum temperature of the 3D IC is selected as the criterion to find the appropriate grid distribution. This parameter may be the most sensitive factor to grid changes as well as is more liable to mesh sizing for the second boundary condition.

In Table 2, $\Delta T_{min}$ is equal to the difference of the minimum temperature of the IC predicted by the mesh set-up in a given row and the minimum temperature computed from the coarser grid in the prior row. Based on the data shown in Table 2, Grid set #3 can be selected for a simulation.

TABLE 2

Study of the independence of the results from the solution grid

| Grid Case no. | Number of cells | $T_{min}$ | $\Delta T_{min}$ |
|---|---|---|---|
| 1 | 33765 | 15.70 | — |
| 2 | 63615 | 15.49 | 0.21 |
| 3 | 126400 | 15.34 | 0.15 |
| 4 | 239294 | 15.29 | 0.05 |

For validation, a cylinder with L/D=0.5 can be considered for which the bottom and peripheral surfaces can be held at $T_\infty=40°$ C. and the top surface can be kept at $T_0=15°$ C. An analytical solution is available for this problem, which can be used as a criterion for the accuracy and validity of the numerical method.

The analytical solution for this problem can be stated as follows:

$$T(r, z) = T_\infty + 2(T_0 - T_\infty)\sum_{n=1}^{\infty} \left(\frac{\sinh\lambda_n z}{\sinh\lambda_n L}\right)\frac{J_0(\lambda_n r)}{(\lambda_n R)J_1(\lambda_n R)} \quad (19)$$

where $\lambda_n$ are roots of the equation $J_0(\lambda_n R)=0$; r is the radial distance measured from the center, and Z is the altitudinal distance measured from the bottom surface.

Figure 3:
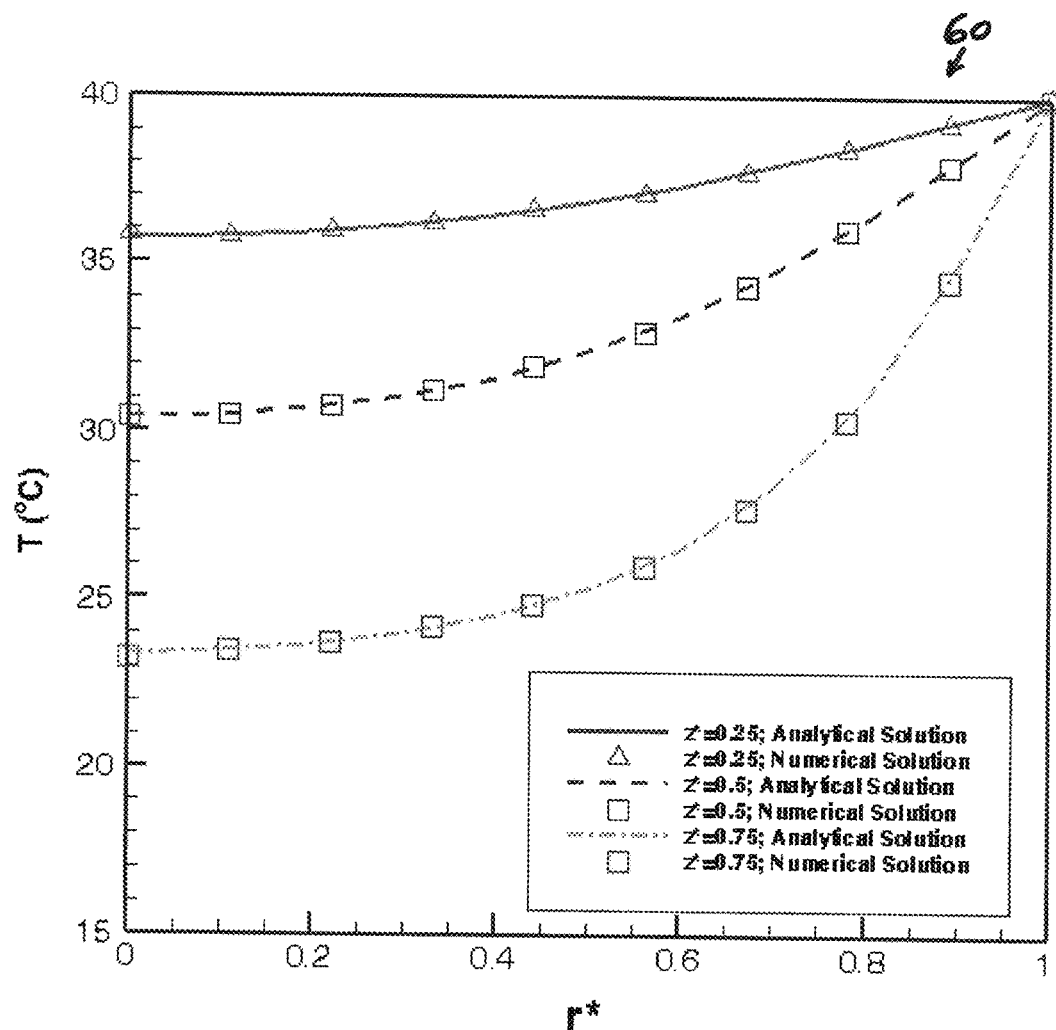
FIG. 3 illustrates a graph depicting data comparing the numerical temperature predictions with a specified analytical solution, in accordance with an embodiment.

FIG. 3 illustrates a graph 60 depicting a comparison between the current numerical results and the analytical counterparts at three dimensionless heights: $z^*=z/L=0.25$, 0.50, 0.75. As can be seen, an excellent agreement is observed.

The configuration for the high conductivity inserts (HCI) such as the inserts 45, 57 and 49, 51 depicted in FIG. 2 can be taken as a ring. At the first stage, all of the HCl can be lumped in a single ring. Having examined different locations of the ring, the temperature distribution and max temperature of the 3D IC device 11 can be obtained. At the next step, the same volume of HCl can be divided equally into two rings and following a similar procedure for the first step, the architecture/location of the rings are determined. Finally, for each heat sink boundary condition, the optimal distribution factor for each optimized location can be found.

Figure 4:
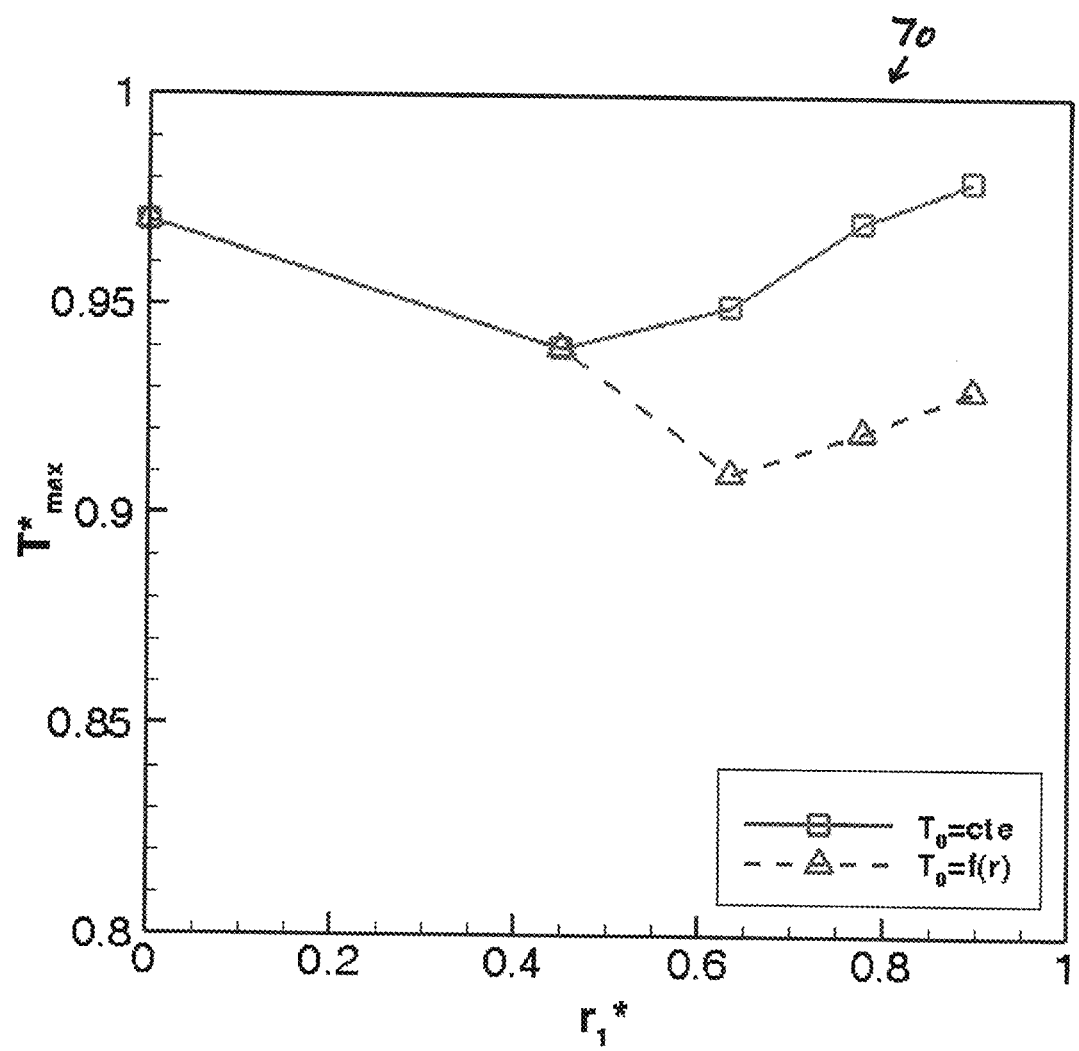
FIG. 4 illustrates a graph depicting data indicative of the maximum temperature of the IC structure for the two boundary conditions utilizing a single layer of the high-conductivity insert, in accordance with an embodiment.

FIG. 4 illustrates a graph 70 depicting the dimensionless maximum temperature, $T_{MAX}^*$, of the IC structure invoking a single layer of high-conductivity insert for both B.Cs. From this figure, it is evident that there are optimum locations for high conductivity inserts for both types of boundary conditions. However, these locations do not coincide.

When the high conductivity insert is located at the center, the hotspots appear at the edge of the setup. Since the volume of the HCl is fixed, the radial ring thickness decreases when we move away from the center. As the high conductivity ring approaches the hot spot there is an optimum point that when the ring passes that point, the hotspot relocates towards the inner part. These aspects are clarified in FIGS. 5 to 7.

It should be noted that the locations of the extrema depend on the heat sink boundary condition. That is, when there is a constant temperature B.C for the heat sink, the optimum point for the inserted ring resides closer to the center. This is because the heat sink temperature at the outer part of the piece for the second B.C. is higher than that of the first boundary condition which in turn results in a lower temperature gradient at those parts. As such, by moving the high conductivity ring closer to the edge, this lower temperature gradient is compensated by the higher thermal conductivity.

As expected, the value of the maximum temperature is different for the two boundary conditions. However, the value of the dimensionless maximum temperatures is the same for both B.Cs. For instance, when the high conductivity insert is located at the center, the max temperature would be 53.85° C. and 63.10° C. for the first and second B.C respectively. While the value of the dimensionless Max. temperature is 0.97 for both boundary conditions. The dimensionless maximum temperature indicates the effectiveness of utilization of the high conductivity insert in cooling the 3D ICs. For the optimized conditions, the dimensionless maximum temperatures are 0.94 and 0.91, for first and second B.Cs., respectively. Whereas the dimensionless maximum temperature for plain heat spreader (without high conductivity insert) of triple diameter (30 mm) is 0.97. This highlights the significant role of HIC in cooling the 3D ICs.

Figure 5:
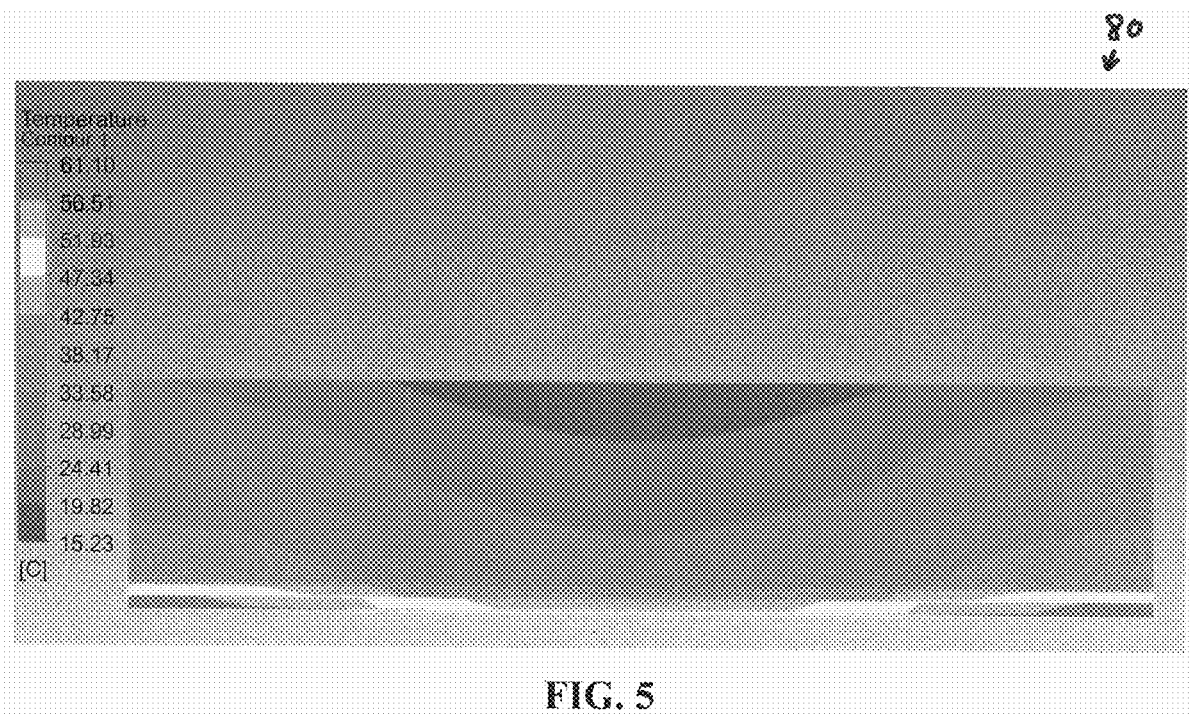
FIG. 5 illustrates a graph of temperature counters for an IC structure using a single layer of the high-conductivity insert for $r_1^*=0$ and $T_0=f(r)$, in accordance with an embodiment.
Figure 6:
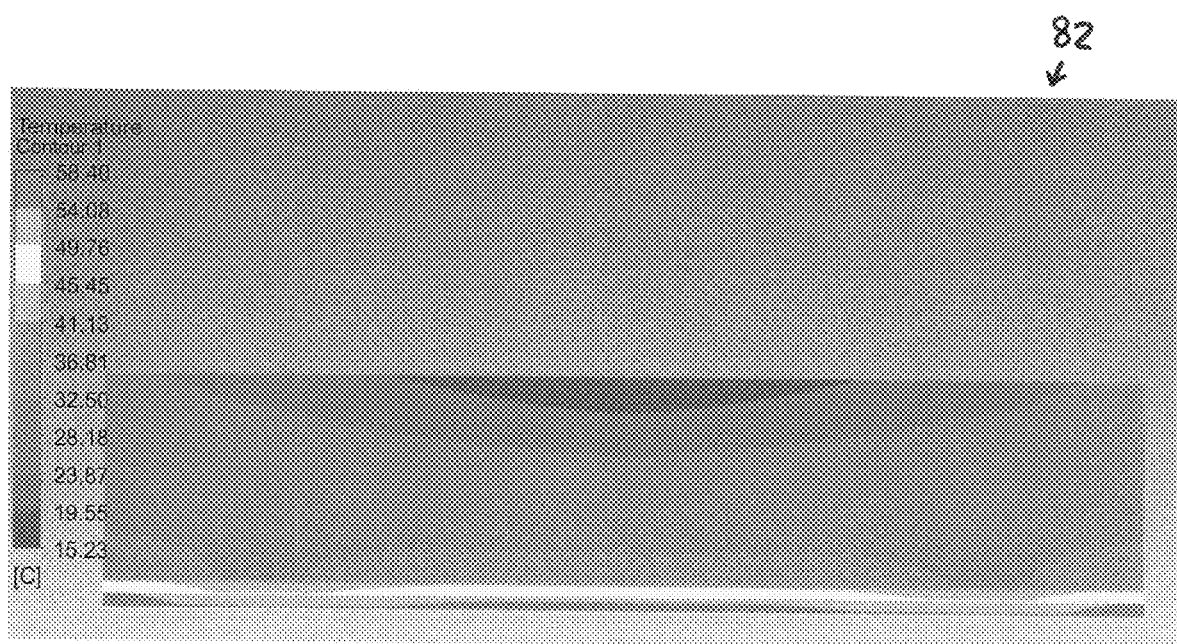
FIG. 6 illustrates a graph of temperature contours for the IC structure utilizing a single layer of high-conductivity insert for $r_1^*=0.632$ and $T_0=f(r)$, in accordance with an embodiment.
Figure 7:
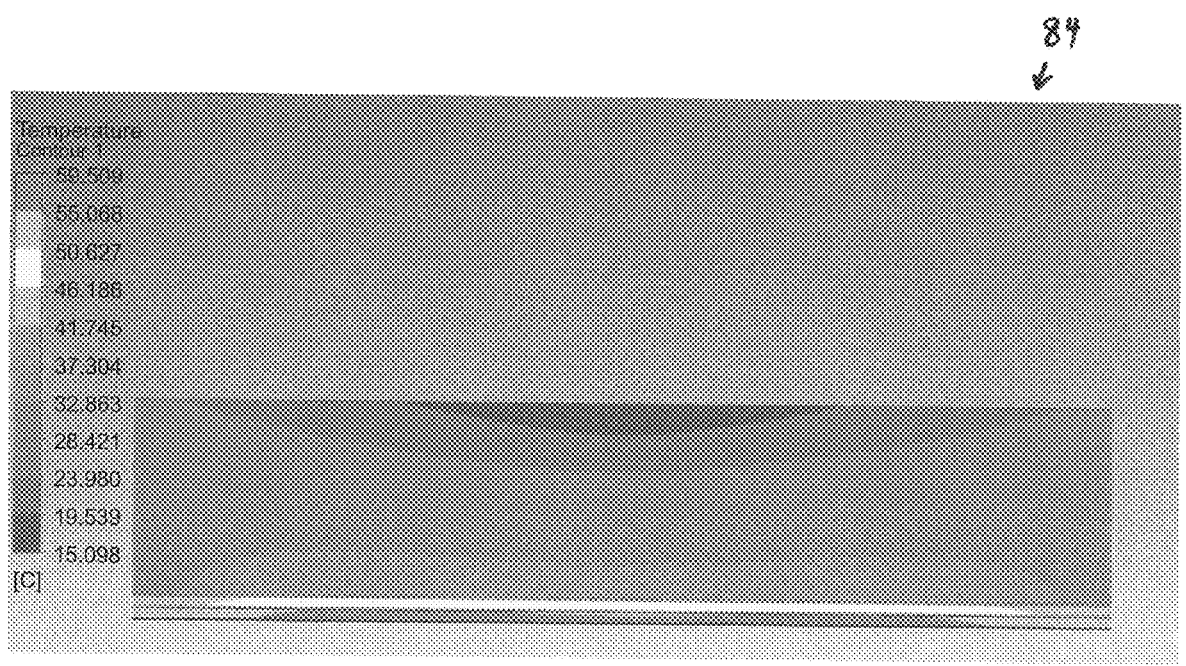
FIG. 7 illustrates a graph of temperature contours for the IC structure using a single layer of high-conductivity insert for $r_1^*=0.894$ and $T_0=f(r)$, in accordance with an embodiment.

To have a better insight into the impact of high conductivity insert on temperature distribution throughout the 3D IC, the temperature contours for different configurations of the structure including single HCl are shown in graph 80, graph 82, and graph 84 in FIGS. 5 to 7. The graph 80 shown in FIG. 5 represents the temperature contours of the IC structure utilizing a single layer located at the center of the piece based on the second heat sink B.C. This figure indicates that the hotspot location is at the edge of the piece. Further, the sharp variation in contour slope designates the change in the thermal conductivity.

FIG. 6 shows a graph 82 depicting the temperature contours of the IC structure with a single layer of high-conductivity insert for $r_1^*=0.632$ based on the second boundary condition for the heat sink. This contour corresponds to the optimum configuration of a single ring spreader. In this situation, the distribution of the temperature for the IC is more uniform than the other configuration. It should be noted that we have nearly two hot spots for this case. One is located at the edge while the other is located at the center of the IC. The advantage is that the hot spot temperature has been reduced.

FIG. 7 shows a graph 84 indicating the temperature contours for the IC structure with a single layer of high-conductivity insert located at the outermost radius of the spreader for the second boundary condition. The location of the hotspots is moved close to the central part. The maximum temperature does not exactly occur at the center since the temperature of the heat sink experiences its minimum at the coolant entrance (center of the heat sink). This is not the case for the first B.C. due to the constant heat sink temperature since the temperature increases with distance from the high conductivity ring.

Figure 8:
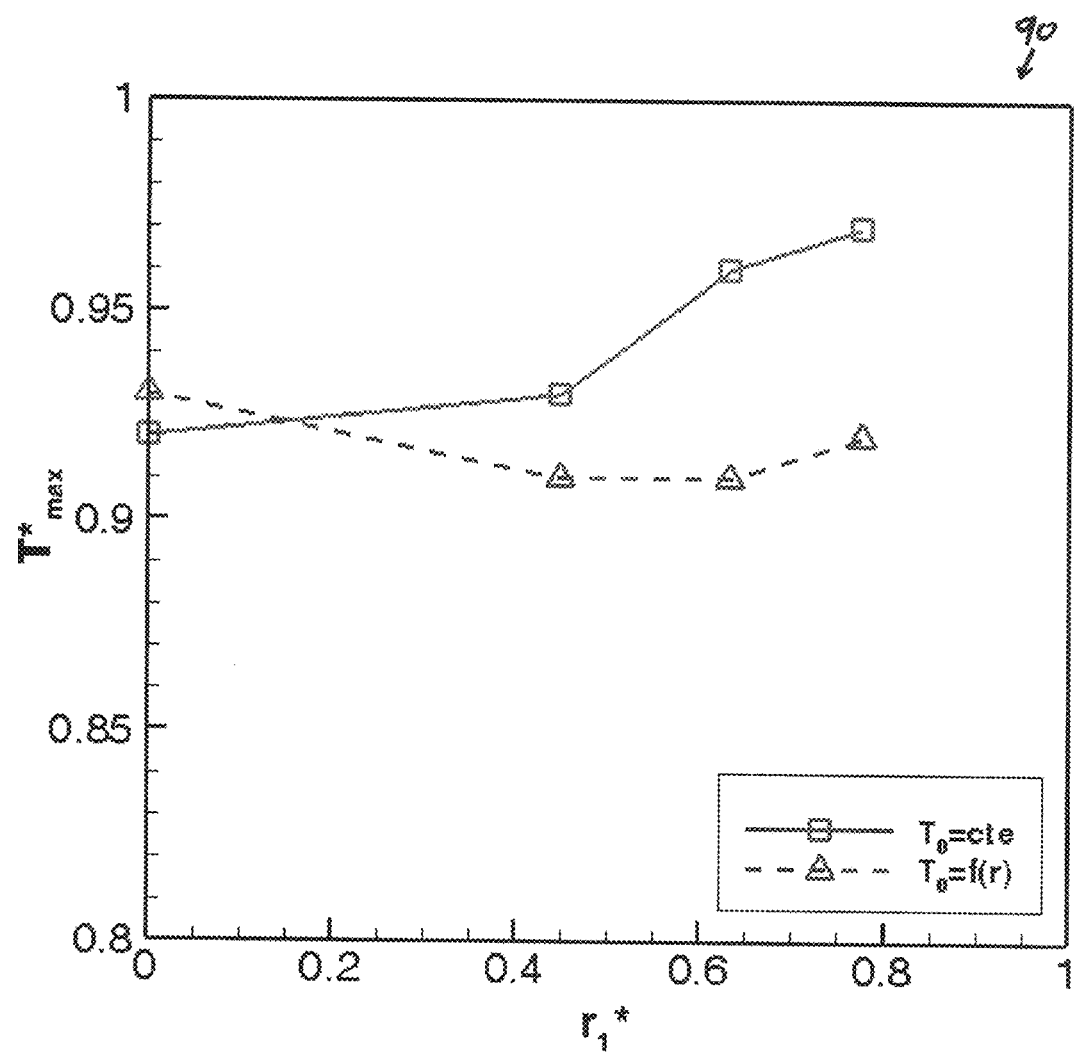
FIG. 8 illustrates a graph indicating the maximum temperature of the IC structure for the two boundary conditions using two layers of high-conductivity insert for $r_2^*=R$, in accordance with an embodiment.

FIG. 8 illustrates a graph 90 that depicts the maximum temperature of the IC structure invoking two layers of the high-conductivity insert when the external ring location is pinned at the edge of the spreader. The result shows that for the first B.C., the optimized location for the first ring is at the center. This means that the farther away these two rings are, the better cooling performance is achieved.

Regarding the second B.C, there may be a fixed ring at the outer edge. If the second ring is too close to the center, it will deviate from the optimal conditions since the temperature gradient is maximum at the center. That is, in going from the center towards the perimeter, the temperature gradient is reduced while the equivalent thermal conductivity can be enhanced. Therefore, the optimal conditions can occur when the internal ring may be dislocated from the center of the heat spreader.

Figure 9:
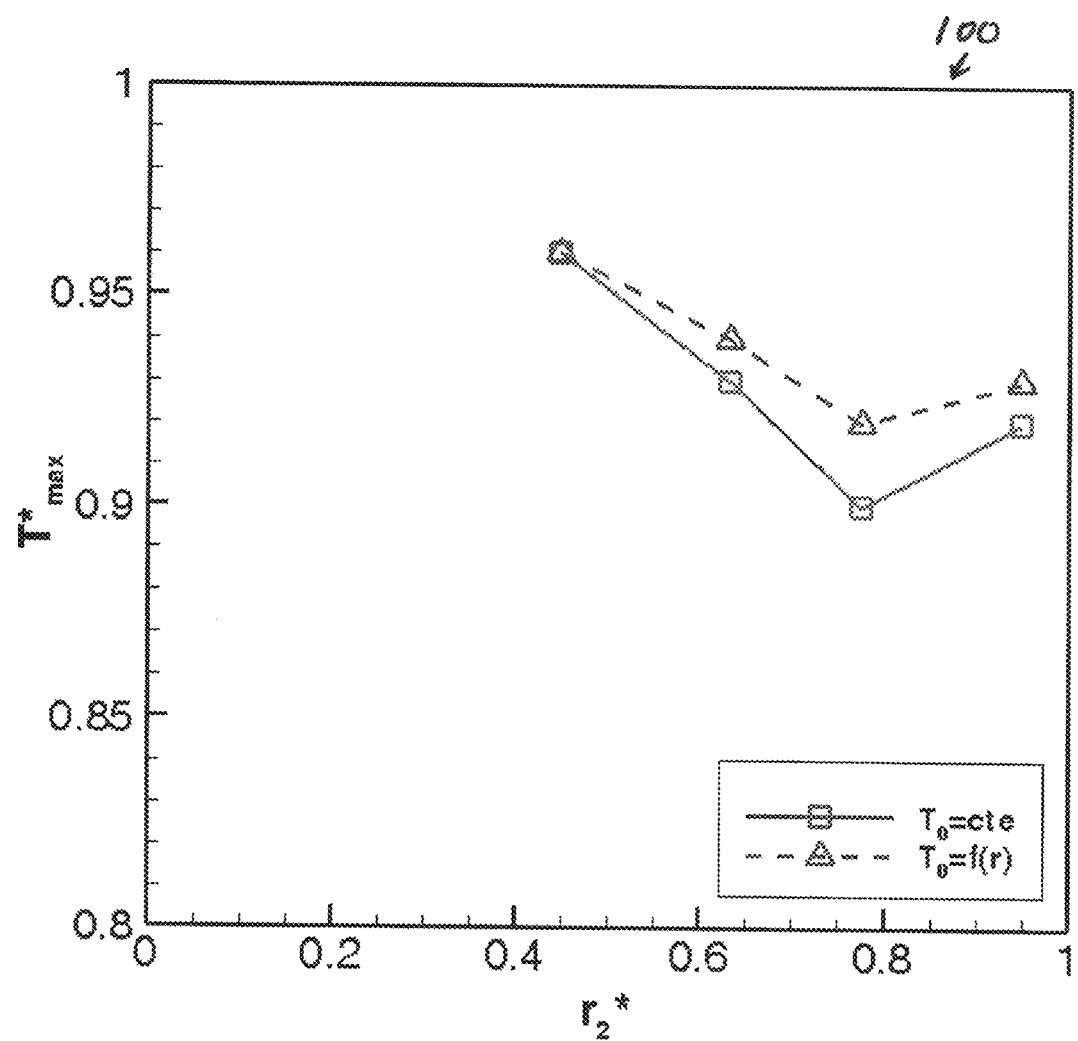
FIG. 9 illustrates a graph indicating the maximum temperature of the IC structure for the two boundary conditions using two layers of high-conductivity insert for $r_1=0$, in accordance with an embodiment.

Based on the result shown in graph 90 of FIG. 8, the next step in improving the configuration can involve fixing the location of the internal HCl at the center of the heat spreader 14. FIG. 9 depicts a graph 100 showing that the maximum temperature of the IC structure with two layers of the high-conductivity insert when the internal HCl is fixed in the center of the heat spreader 14, while the outer ring location can be varied to yield the optimal configuration. The behavior of the dimensionless maximum temperature for both boundary conditions is similar. However, the effectiveness of utilizing HCl may be better for the first B.C. For both B.Cs, the optimal structure can be achieved when the second ring is located at $R_2^*=0.774$.

Graph 100 shown in FIG. 9 can be based on the second B.C. as compared to graph 90 of FIG. 8. For both configurations, the internal ring can be located at the center, while the location of the outer one may be different. Graph 100 in FIG. 9 demonstrates that the location of the outer ring observed in graph 90 in FIG. 8 (which had been fixed) may not be optimal; that is if we let the structure morph, the optimal location of FIG. 9 can be obtained.

Two opposite effects emerge when dislocating the outer ring towards the perimeter. First, the distance between the HCl ring increases which tends to make the temperature distribution of the IC structure more uniform. Second, the radial thickness of the outer ring is reduced which leads to attenuated thermal conduction. These two contradicting features produce an optimal location for the outer ring.

Figure 10:
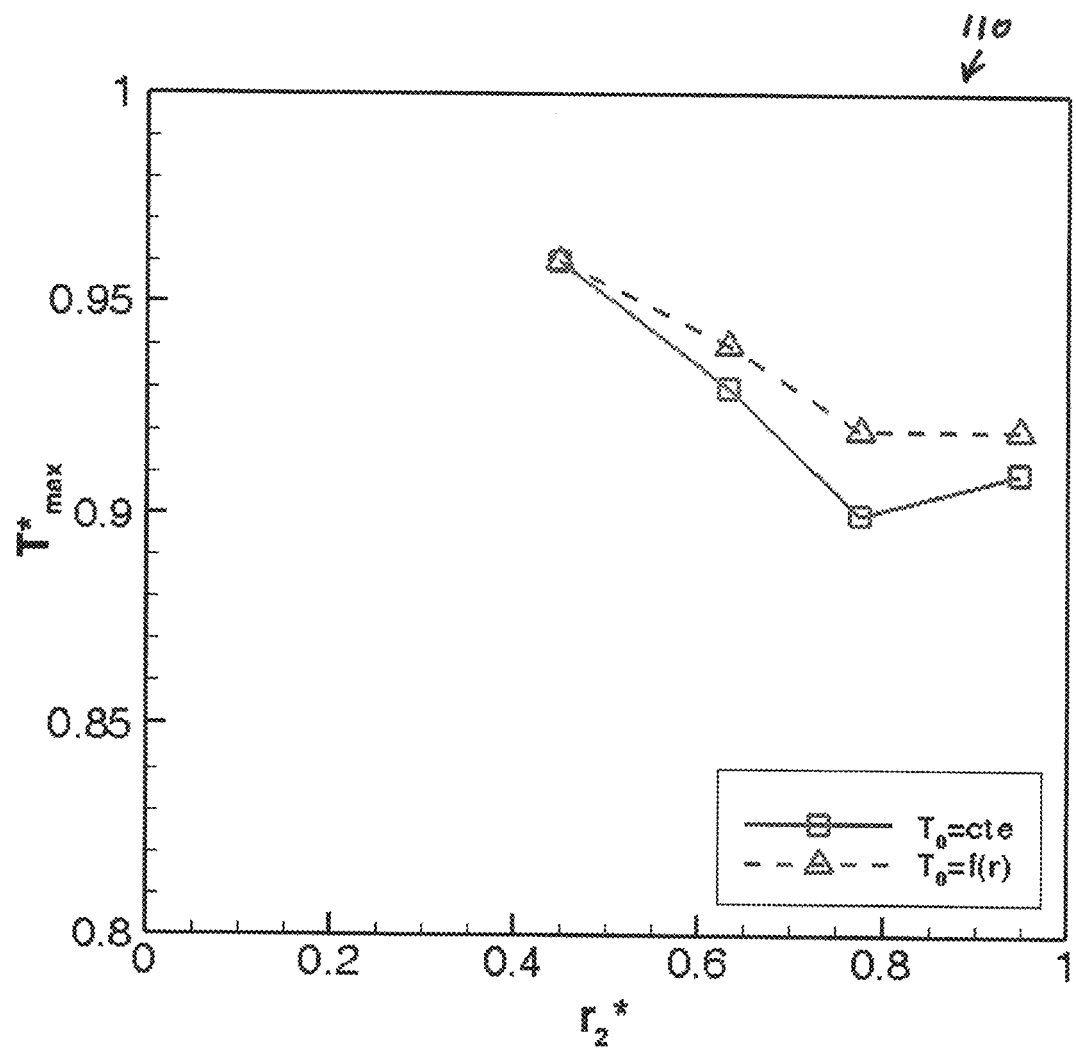
FIG. 10 illustrates a graph indicating the maximum temperature of the IC structure for the two boundary conditions using two layers of high-conductivity insert for $r_1=0.25r_2$ in accordance with an embodiment.

FIG. 10 illustrates a graph 110 that displays the maximum temperature of the IC structure with two layers of high-conductivity insert for $r_1=0.25r_2$. It can be observed from this figure that the best location for the outer ring can be the same for both boundary conditions at $R_2^*=0.774$. The spacing between the successive rings can be:

$$\Delta r = r_2 - r_1 = r_2 - 0.25r_2 = 0.75r_2 \quad (20)$$

Therefore, the spacing between the rings can increase as the outer ring radius increases, which has a favorable effect; since it tends to make the temperature more uniform. On the other hand, similar to FIG. 9, higher values of $r_2$ lead to thinner HCl rings which deteriorates the cooling efficacy. This means that an optimal location for the rings does exist. Also seen in this figure is the behavior of the second B.C. As it can be seen, when $r_2$ surpasses the optimum point of $r_2^*=0.774$, $T_{max}$ does not vary remarkably. For this Boundary condition, the temperature gradient is reduced as we move towards the edge. Hence, it is better to bring the ring closer to the edge. In graph 110 in FIG. 10, it can be seen that the curve before the optimum point is steeper than the curve after that which implies that the effect of distancing the rings is more pronounced at lower values of rings radii.

Figure 11:
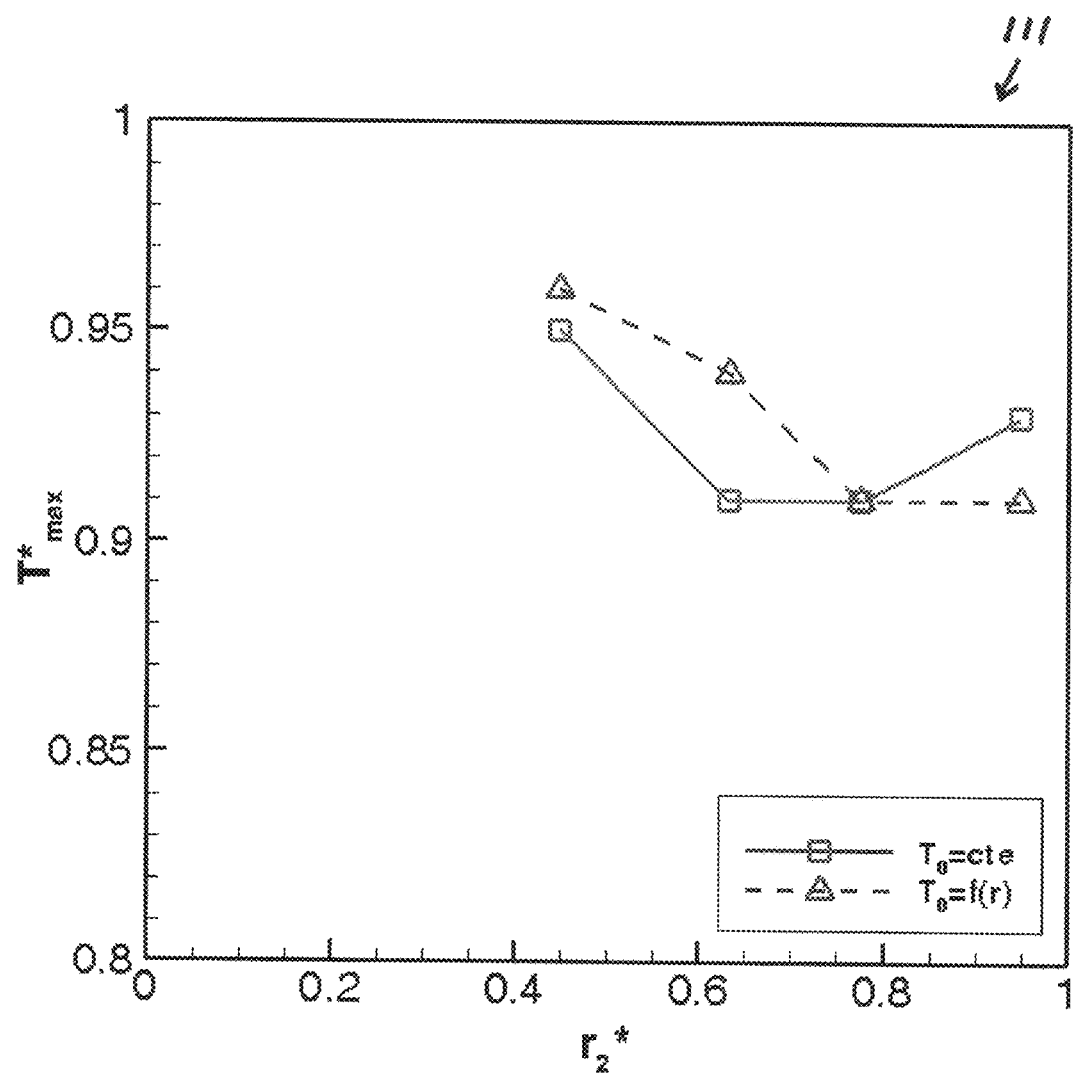
FIG. 11 illustrates a graph indicating the maximum temperature of the IC structure for the two boundary conditions using two layers of high-conductivity insert for $r_1=0.5r_2$ in accordance with an embodiment.

FIG. 11 depicts a graph 111 showing a maximum temperature of the IC structure invoking two layers of high-conductivity insert for $r_1=0.50r_2$. It is interesting to note that both curves are optimal in a range of ring radii rather than a single specified radius. Therefore, an optimum design exists. It is also seen that the effectiveness of using HCl as a heat spreader is not sensitive to the boundary condition for an optimal situation.

Figure 12:
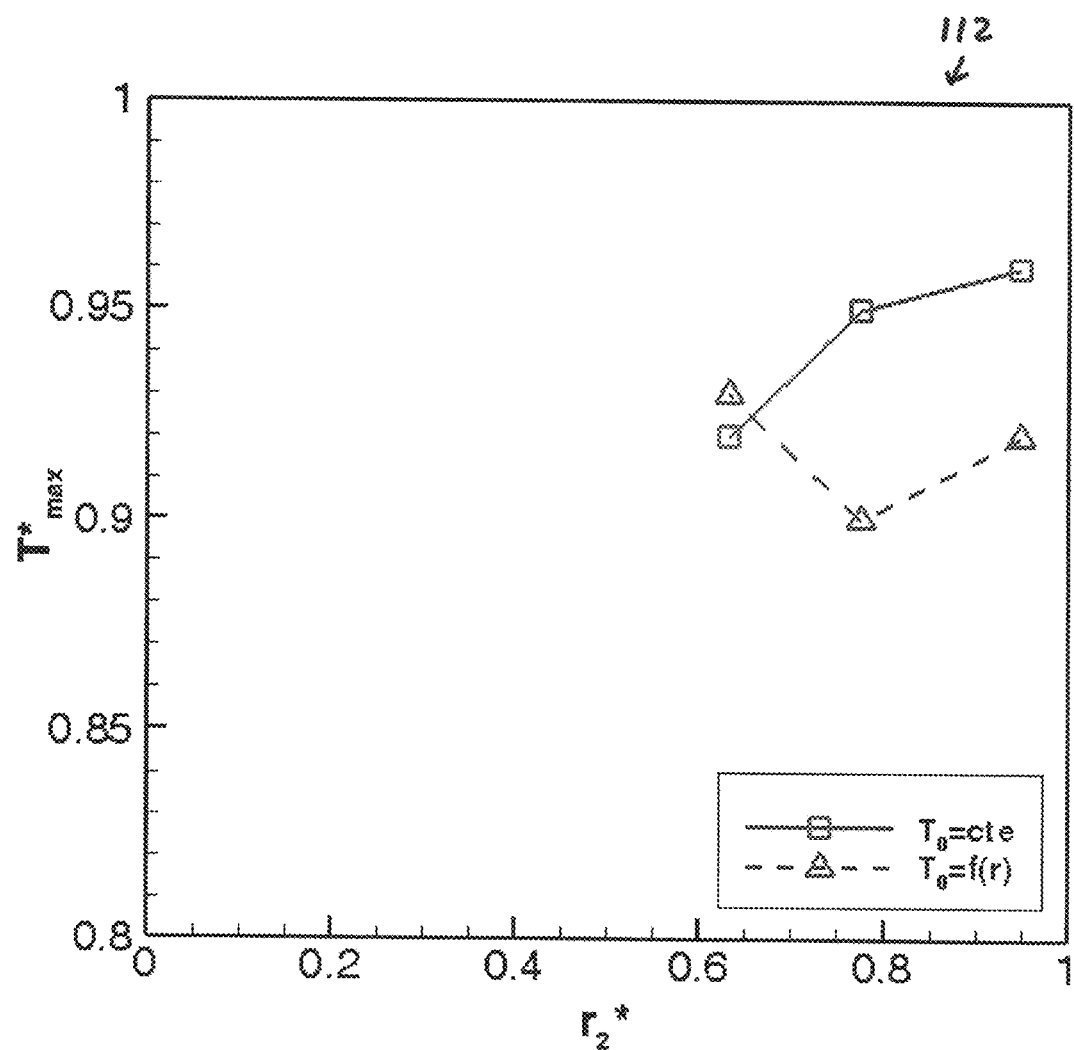
FIG. 12 illustrates a graph showing the maximum temperature of the IC structure for the two boundary conditions using two layers of high-conductivity insert for $r_1=0.75r_2$ in accordance with an embodiment.

Next, the correlation between the locations for the two rings is taken as $r_1=0.75r_2$, which means the successive rings reside closer to each other. Therefore, if the rings are not placed far enough from the center, they would be merged. Thus, we may. not convey this condition for low values of $r_1$ and $r_2$. The results for this case are shown in graph 1112 in FIG. 12.

Since the values of $r_1$ and $r_2$ are beyond a threshold, the impact of distancing the rings is less than the effect of reducing the thickness of the rings. Therefore, for the first B.C., an ascending trend is observed when $r_1$ and $r_2$ are increased. On the contrary, for the second boundary condition, as the temperature gradient plays a role in the thermal conduction, a minimal value for $T_{max}^*$ is obtained concerning $r_1$ (or $r_2$).

Finally, the optimal configuration of the composite heat spreader 14 obtained can be adopted for further optimization for the volume ratio. The optimal configurations for the first and second B.C. are as follows:

$$r_1^* = \begin{cases} 0.194 & 1^{st} B.C \\ 0.580 & 2^{nd} B.C \end{cases} \quad (21)$$

$$r_2^* = 0.774 \quad \text{Both } B.Cs \quad (22)$$

Figure 13:
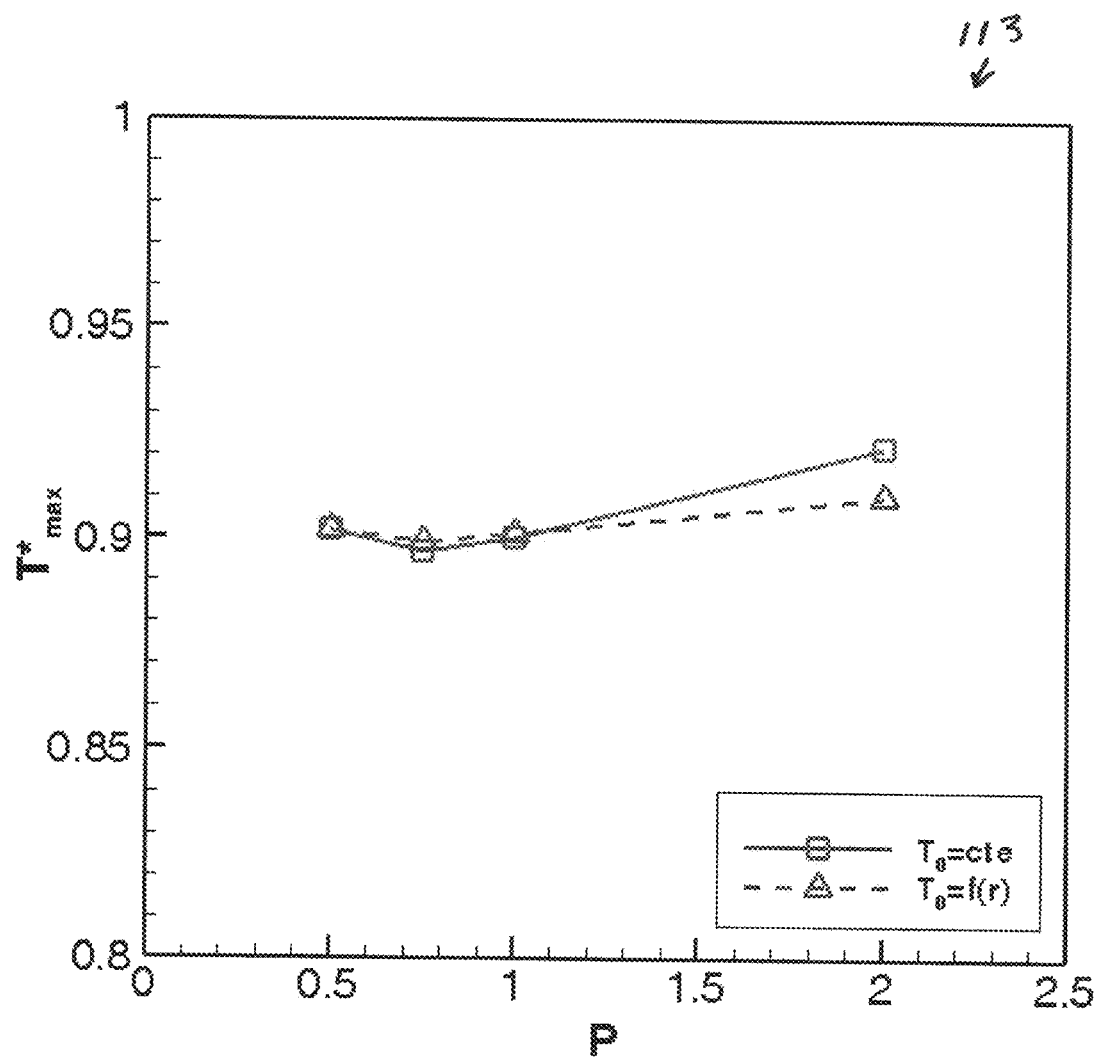
FIG. 13 illustrates a graph depicting the maximum temperature of the optimal IC structures for the two boundary conditions using two layers of high-conductivity inserts with different volume ratios in accordance with an embodiment.

Having fixed the locations of the rings, the maximum temperature of the 3D IC can be achieved for various volume ratios. The results are illustrated in graph 112 of FIG. 13. According to this figure, there exists a volume ratio for which the configuration is optimized, again. This optimal volume ratio is 0.75 for both B.Cs. That is to achieve the most optimum cooling of the 3D IC, we need to allocate more HCl to the outer rings. As the outer ring has a larger inner radius, if we want to have a balanced thickness over the rings, more HCl should be allotted to the outer ring. If the amount of HCl for the outer ring exceeds a limit, again the balance between the rings will be violated which will lead to an attenuated result. The final optimal results for the aforementioned B.C.s are:

$$r_1^* = \begin{cases} 0.194 & 1^{st} B.C \\ 0.580 & 2^{nd} B.C \end{cases} \quad (23)$$

$$r_2^* = 0.774 \quad P = 0.75 \quad (24)$$

This means that for this final optimal condition, the dimensionless maximum temperature is reduced by more than 10% which corresponding to more than a 4° C. decrease in the maximum temperature of the 3D IC.

A detailed numerical study may be accomplished to investigate the effects of adding high conductivity inserts within the heat spreader of a 3D IC. Two ring configurations, that is a single layer and a double layer, can be considered. An optimization procedure can be followed for finding the proper locations for the rings as well as achieving the best distribution for the high conductivity material between the rings. Results can show that there exist optimum locations for placing the HCl rings. Also, there is an optimal value (e.g., P=0., 5) for the allocation of the HCl material to the rings. It was found that for the final optimal condition, the dimensionless maximum temperature of the 3D IC could be lowered by more than 10%.

| Nomenclature | |
|---|---|
| $c_p$ | specific heat at constant pressure [J(kg · K)$^{-1}$] |
| h | convective heat transfer coefficient [W(m$^2$ · K)$^{-1}$] |
| H | height [m] |
| k | thermal conductivity [W(m · K)$^{-1}$] |
| L | length [m] |
| n | normal coordinate |
| Nu | Nusselt number [h · H/k$_f$] |
| p | pressure [Pa] |
| P | volume ratio |
| $\dot{q}_g$ | volumetric heat generation rate [W m$^{-3}$] |
| r | Radial distance [m] |
| $r_1$ | Inner radius of internal ring [m] |
| $r_2$ | Inner radius of external ring[m] |
| R | Radius of the heat spreader |
| Re$_H$ | Reynolds number [$\rho_t u_m H/\mu_f$] |
| T | temperature [K] |
| T*$_{mas}$ | Dimensionless maximum temperature [K] |
| u | x-component of velocity [m s$^{-1}$] |

-continued

| | Nomenclature |
|---|---|
| v | y-component of velocity [m s$^{-1}$] |
| w | z-component of velocity [m s$^{-1}$] |
| x, y, z | Cartesian coordinates |
| | Greek Symbols |
| μ | dynamic viscosity [(N · s) m$^{-2}$] |
| Θ | dimensionless temperature [(T − T$_e$)/(q"H/k$_f$)] |
| ρ | density [kg m$^{-3}$] |
| ∅ | volume fraction |
| | Superscripts |
| f | Fluid |
| e | entrance |
| m | mean |
| max | maximum |
| o | outlet |
| s | solid |
| * | dimensionless |

Embodiments can be implemented through the design and optimization of Boron Arsenide insert structures embedded in the heat spreader of a 3D IC. The inserts can be distributed in three main configurations: radial, one level of pairing, and two levels of pairing. The considered heat spreader can be configured from a composite of copper and highly conductive blades made of Boron Arsenide with high thermal conductivity. The structures corresponding to the lowest maximum temperature of the 3D IC while the ratio of the Boron Arsenide volume to the whole heat spreader volume is fixed, can be established. Four different boundary conditions can be examined to seek their impact on the optimal configuration of the inserts. The results show that for the constant temperature, variable temperature, convection heat transfer boundary conditions at optimal conditions, the maximum temperature of the whole structure can be reduced by, for example, 13.7%, 11.9%, and 13.9%, respectively; while the size of the heat sink, and heat spreader can be mitigated 200%.

Figure 14:
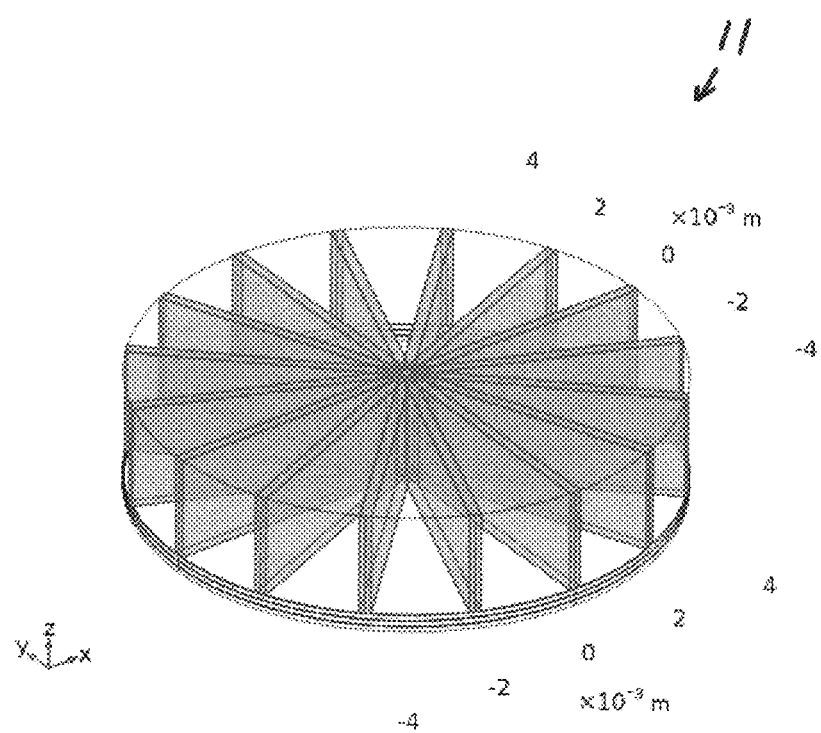
FIG. 14 illustrates a schematic diagram of a 3D integrated circuit device having a radial configuration with 16 blades, in accordance with an embodiment.
Figure 15A:
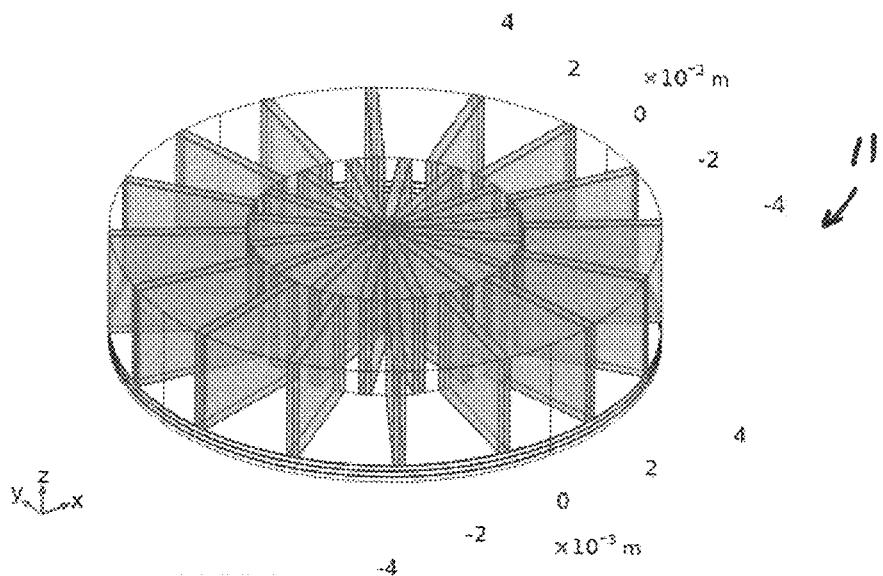
FIG. 15a and FIG. 15b illustrate schematic diagrams of a 3D integrated circuit device having one level pairing configurations with $N_1=16$ and, respectively, $N_2=16$, and $N_2=32$, in accordance with an embodiment.
Figure 15B:
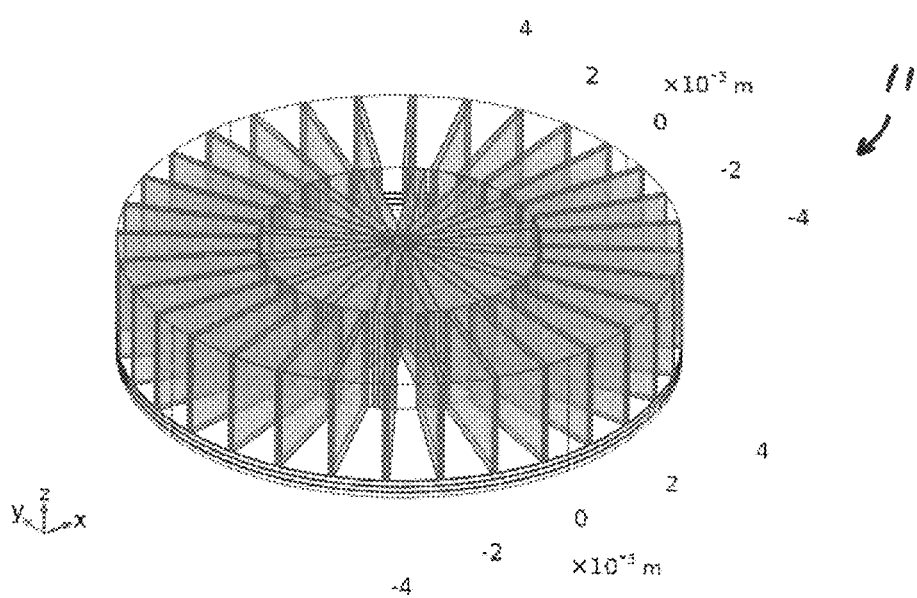
Figure 16A:
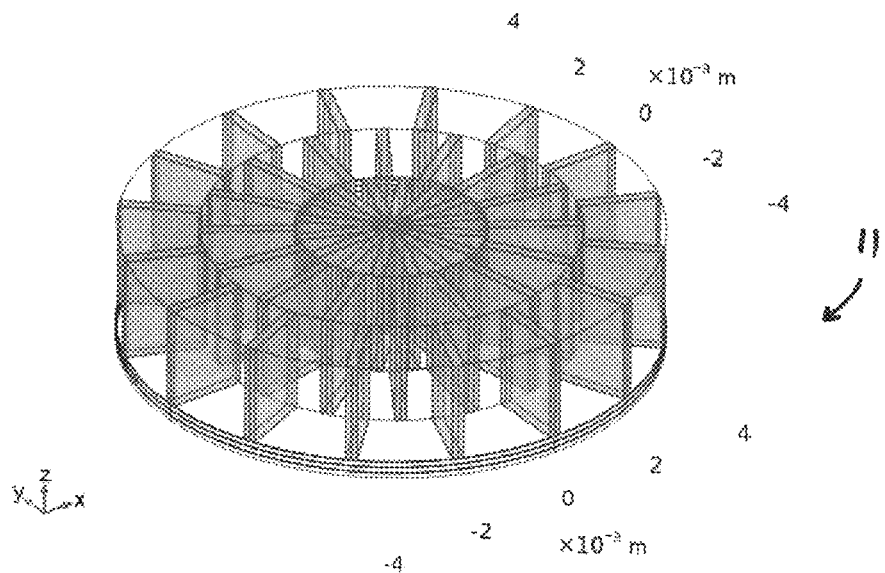
FIG. 16a and FIG. 16b illustrate schematic diagrams of a 3D integrated circuit device having two level pairing configurations with $N_1=16$, $N_2=16$, and respectively $N_3=16$, and $N_3=32$, in accordance with an embodiment.
Figure 16B:
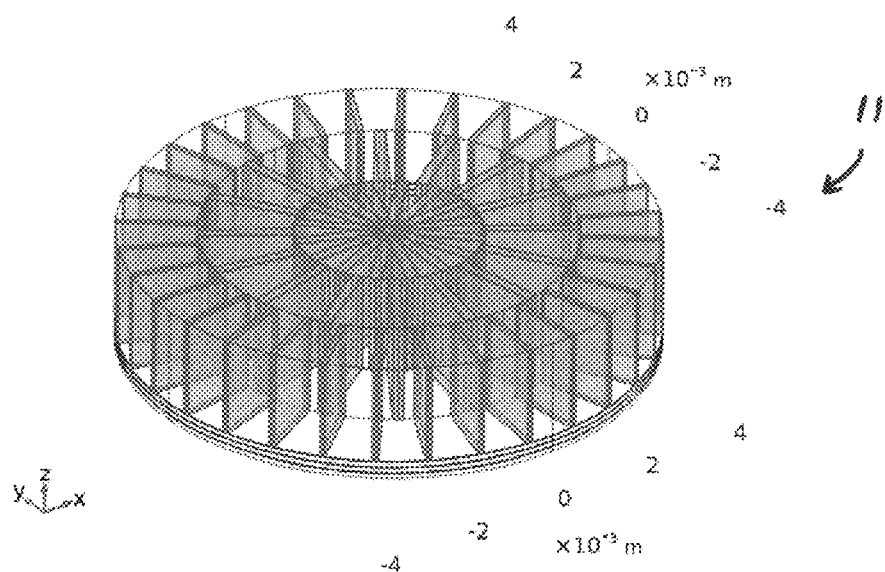

FIG. 14 illustrates a schematic diagram of the 3D integrated circuit device 11 having a radial configuration with 16 blades, in accordance with an embodiment. FIG. 15a and FIG. 15b illustrate schematic diagrams of the 3D integrated circuit device 11 having one level pairing configurations with $N_1$=16 and, respectively, $N_2$=16, and $N_2$=32, in accordance with an embodiment. FIG. 16a and FIG. 16b illustrate schematic diagrams of a 3D integrated circuit device 11 having two level pairing configurations with $N_1$=16, $N_2$=16, and respectively $N_3$=16, and $N_3$=32, in accordance with an embodiment.

The optimal configuration of the high conductivity inserts can be found throughout the heat spreader 14. For this purpose, three main structures can be considered: radial, one level of pairing and two levels of pairing. In all of the configurations, the thickness of the inserts may be the same as the thickness of the heat spreader 14. In the radial configuration, inserts can reside as straight blades connecting the center of the heat spreader 14 to its perimeter as shown in FIG. 1. This figure shows a radial configuration for 16 inserts. It can be appreciated the number of inserts, in this case sixteen, is not a limiting feature of the disclosed embodiments. To optimize this configuration, the number of blades can be doubled while their thickness can be halved. This procedure can be continued until its effect on the maximum temperature of the 3D IC 11 is negligible.

For the one level of pairing configuration, the radial inserts break into outer inward and inner outward incomplete blades inside the heat spreader. FIG. 15a illustrates this configuration for 16 inner blades ($N_1$=16) and 16 outer blades ($N_2$=16); while FIG. 15b shows the case for $N_1$=16 and $N_2$=32. Thus, the angular location of these two sets of inserts can vary independently: providing one more degree of freedom for the optimization process. The location of this breakout is another degree of freedom.

For the two levels of pairing structure, the breakout occurs twice: giving two more degrees of freedom for the optimization. FIG. 16a illustrates this configuration for 16 inner blades ($N_1$=16), 16 middle blades ($N_2$=16), and 16 outer blades ($N_3$=16); while FIG. 16b shows the case for $N_1$=16, $N_2$=16, and $N_3$=32. We can examine various aspects of these configurations. For example, we may want to see if increasing the degrees of freedom, can significantly enhance the heat transfer.

For the heat sink 12, four distinctive boundary conditions can be considered: namely, constant temperature (15° C.), linear variable temperature (between 15° C. at the center and 25° C. at the edge), convection heat transfer with $$h = 100 \frac{W}{m^2 K}$$

and convection heat transfer with $$h = 80 \frac{W}{m^2 K}.$$

The chosen variety of the boundary conditions can enable us to examine their impact on the performance and optimal structure of the highly conductive inserts for the 3D IC 11. Each of these can have a physical counterpart. Moreover, as the boundary conditions may be presented in non-dimensional form, the absolute values of the temperature at the boundary may not impact the non-dimensional results achieved in a study of the 3D IC 11.

It can be appreciated that the embodiments disclosed herein can be implemented in a number of systems and devices, and in the manufacturing of such systems and devices. Examples of systems/devices in which one or more of the embodiments may be implemented include mobile devices and NAND flash memory chips. One example where the disclosed 3D IC (for example, as a 3D IC chip) may find usefulness is in a handheld game console such as the Sony PlayStation Portable (PSB). The Sony PSB can include hardware, for example, such as eDRAM (embedded DRAM) memory in a 3D IC chip (e.g., a 3d system-in-package chip) with two dies stacked vertically. This semi-embedded DRAM arrangement has also been referred to as a 'chip-on-chip' (CoC) solution. Other examples where the embodiments can be implemented include multi-layer 3D IC's, embedded NAND flash memory, and multi-chip package and package on package solutions for NAND flash memory in mobile devices. Other devices in which the embodiments can be implemented include High Bandwidth Memory (HBM) including stacked chips and TSVs.

Based on the foregoing, it can be appreciated that a number of embodiments including preferred and alternative embodiments are disclosed herein. For example, in one embodiment, a 3D integrated circuit device, can include a substrate; a thermal interface layer and at least one die; at least one device layer bonded between the thermal interface layer and the at least one die, wherein the thermal interface layer enhances conductive heat transfer between the at least one device layer and the at least one die; and a heat sink located adjacent to a heat spreader, wherein the thermal interface layer, the at least one die and the at least one device layer are located between the heat spreader and the substrate.

In an embodiment of the 3D integrated circuit device, the heat sink can include a coolant entrance and at least one coolant exit, wherein a coolant enters the heat sink through the coolant entrance and exits the heat sink through the at least one coolant exit.

In an embodiment of the 3D integrated circuit device, the at least one device layer can include at least one electronic subsystem.

In an embodiment of the 3D integrated circuit device, the at least one electronic subsystem can include one or more of: a processor, a memory, a sensor, etc.

In an embodiment of the 3D integrated circuit device, the heat spreader can comprise a high conductivity insert.

In an embodiment of the 3D integrated circuit device, the high conductivity insert can comprise Boron Arsenide.

An embodiment of the 3D integrated circuit device can comprise a blade configuration.

An embodiment of the 3D integrated circuit device can comprise a ring configuration.

In an embodiment of the 3D integrated circuit device, the substrate, the thermal interface layer, the at least one die, the at least one device layer, the heat spreader, and the heat sink can be arranged with respect to one another in the ring configuration.

In an embodiment of the 3D integrated circuit device, the ring configuration can comprise a single layer ring configuration.

In an embodiment of the 3D integrated circuit device, the ring configuration can comprise a double layer ring configuration.

In an embodiment of the 3D integrated circuit device, the thermal interface layer can comprise C4 bumps that connect the substrate and the at least one die closest to the substrate.

In an embodiment of the 3D integrated circuit device, the thermal interface layer further can comprise micro-bumps for bonding the at least one device layer to at least one layer above the at least one device layer.

In an embodiment of the 3D integrated circuit device, the heat generated in the at least one electronic subsystem can be conducted through the thermal interface layer to the heat sink.

In an embodiment of the 3D integrated circuit device, the size of the heat spreader can be the same size as a size of thermal interface layer and a size of the at least one device layer.

In an embodiment, a method of manufacturing a 3D integrated circuit device, can involve: providing a substrate; providing a thermal interface layer and at least one die; bonding at least one device layer between the thermal interface layer and the at least one die, wherein the thermal interface layer enhances conductive heat transfer between the at least one device layer and the at least one die; and locating a heat sink adjacent to a heat spreader, wherein the thermal interface layer, the at least one die and the at least one device layer are located between the heat spreader and the substrate.

An embodiment of the method can further involve configuring the heat sink to comprise a coolant entrance and at least one coolant exit, wherein a coolant enters the heat sink through the coolant entrance and exits the heat sink through the at least one coolant exit.

In an embodiment of the method can further involve configuring the at least one device layer to comprise at least one electronic subsystem.

An embodiment of the method can further involve configuring the at least one electronic subsystem to comprise at least one of: a processor, a memory, and a sensor.

In an embodiment of the method can further involve configuring the heat spreader to comprise a high conductivity insert.

An embodiment of the method can further involve configuring the high conductivity to comprise Boron Arsenide.

An embodiment of the method can further involve configuring the 3D integrated circuit device to comprise a blade configuration.

An embodiment of the method can further involve configuring the 3D integrated circuit device to comprise a ring configuration.

An embodiment of the method can further involve arranging the substrate, the thermal interface layer, the at least one die, the at least one device layer, the heat spreader, and the heat sink with respect to one another in the ring configuration.

In an embodiment of the method, the ring configuration can comprise a single layer ring configuration.

In an embodiment of the method, the ring configuration can comprise a double layer ring configuration.

In an embodiment of the method, the thermal interface layer can comprise C4 bumps that connect the substrate and the at least one die closest to the substrate.

In an embodiment of the method, thermal interface layer can further comprise micro-bumps for bonding the at least one device layer to at least one layer above the at least one device layer.

In an embodiment of the method, heat generated in the at least one electronic subsystem can be conducted through the thermal interface layer to the heat sink.

In an embodiment of the method, the size of the heat spreader can be the same size as a size of thermal interface layer and a size of the at least one device layer.

An embodiment of the method can involve arranging the substrate, the thermal interface layer, the at least one die, the at least one device layer, the heat spreader, and the heat sink with respect to one another in the ring configuration; and configuring the 3D integrated circuit device to comprise at least one of: a blade configuration and a ring configuration; or configuring the 3D integrated circuit device to comprise the blade configuration and the ring configuration In an embodiment, a 3D integrated circuit device can comprise a substrate; a thermal interface layer and at least one die; at least one device layer bonded between the thermal interface layer and the at least one die; and a heat sink located adjacent to a heat spreader, wherein the thermal interface layer, the at least one die and the at least one device layer can be located between the heat spreader and the substrate.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A 3D integrated circuit device, comprising:
    a substrate;
    a thermal interface layer and at least one die;
    at least one device layer bonded between the thermal interface layer and the at least one die, wherein the thermal interface layer enhances conductive heat transfer between the at least one device layer and the at least one die; and
    a heat sink located adjacent to a heat spreader, wherein the thermal interface layer, the at least one die and the at least one device layer are located between the heat spreader and the substrate.

2. The 3D integrated circuit device of claim 1 wherein the heat sink comprises a coolant entrance and at least one coolant exit, wherein a coolant enters the heat sink through the coolant entrance and exits the heat sink through the at least one coolant exit.

3. The 3D integrated circuit device of claim 1 wherein the at least one device layer comprises at least one electronic subsystem.

4. The 3D integrated circuit device of claim 3 wherein the at least one electronic subsystem comprises at least one of: a processor, a memory, and a sensor.

5. The 3D integrated circuit device of claim 1 wherein the heat spreader comprises a high conductivity insert.

6. The 3D integrated circuit device of claim 5 wherein the high conductivity insert comprises Boron Arsenide.

7. The 3D integrated circuit device of claim 1 further comprising a blade configuration.

8. The 3D integrated circuit device of claim 1 further comprising a ring configuration.

9. The 3D integrated circuit device of claim 8 wherein the substrate, the thermal interface layer, the at least one die, the at least one device layer, the heat spreader, and the heat sink are arranged with respect to one another in the ring configuration.

10. The 3D integrated circuit device of claim 8 wherein the ring configuration comprises a single layer ring configuration.

11. The 3D integrated circuit device of claim 8 wherein the ring configuration comprises a double layer ring configuration.

12. The 3D integrated circuit device of claim 1 wherein the thermal interface layer comprises C4 bumps that connect the substrate and the at least one die closest to the substrate.

13. The 3D integrated circuit device of claim 1 wherein the thermal interface layer further comprises micro-bumps for bonding the at least one device layer to at least one layer above the at least one device layer.

14. The 3D integrated circuit device of claim 1 wherein heat generated in the at least one electronic subsystem is conducted through the thermal interface layer to the heat sink.

15. The 3D integrated circuit device of claim 1 wherein a size of the heat spreader is the same size as a size of thermal interface layer and a size of the at least one device layer.

16. A method of manufacturing a 3D integrated circuit device, comprising:
    providing a substrate;
    providing a thermal interface layer and at least one die;
    bonding at least one device layer between the thermal interface layer and the at least one die, wherein the thermal interface layer enhances conductive heat transfer between the at least one device layer and the at least one die; and
    locating a heat sink adjacent to a heat spreader, wherein the thermal interface layer, the at least one die and the at least one device layer are located between the heat spreader and the substrate.

17. The method of claim 16 further comprising configuring the heat sink to comprise a coolant entrance and at least one coolant exit, wherein a coolant enters the heat sink through the coolant entrance and exits the heat sink through the at least one coolant exit.

18. The method of claim 16 further comprising configuring the heat spreader to comprise a high conductivity insert.

19. The method of claim 18 further comprising configuring the high conductivity insert with Boron Arsenide.

20. The method of claim 16 further comprising:
    arranging the substrate, the thermal interface layer, the at least one die, the at least one device layer, the heat spreader, and the heat sink with respect to one another in the ring configuration; and
    configuring the 3D integrated circuit device to comprise at least one of: a blade configuration and a ring configuration; or
    configuring the 3D integrated circuit device to comprise the blade configuration and the ring configuration.

* * * * *